US010672463B2

(12) United States Patent
Yabuuchi

(10) Patent No.: US 10,672,463 B2
(45) Date of Patent: *Jun. 2, 2020

(54) SEMICONDUCTOR DEVICE

(71) Applicant: Renesas Electronics Corporation, Koutou-ku, Tokyo (JP)

(72) Inventor: Makoto Yabuuchi, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/248,489

(22) Filed: Jan. 15, 2019

(65) Prior Publication Data

US 2019/0147947 A1 May 16, 2019

Related U.S. Application Data

(63) Continuation of application No. 15/957,803, filed on Apr. 19, 2018, now Pat. No. 10,199,096, which is a (Continued)

(30) Foreign Application Priority Data

Sep. 22, 2011 (JP) .................................. 2011-207674

(51) Int. Cl.
*G11C 5/06* (2006.01)
*G11C 11/419* (2006.01)
(52) U.S. Cl.
CPC .................................. *G11C 11/419* (2013.01)
(58) Field of Classification Search
CPC ....... G11C 7/1078; G11C 7/22; G11C 7/1006; G11C 7/1072; G11C 7/1096
(Continued)

(56) References Cited

U.S. PATENT DOCUMENTS 4,415,882 A 11/1983 Akazawa et al.
5,758,056 A 5/1998 Barr
(Continued)

FOREIGN PATENT DOCUMENTS

JP 07-192469 A 7/1995
JP 11-086530 A 3/1999
(Continued)

OTHER PUBLICATIONS

Office Action, dated Apr. 2, 2019, in Japanese Application No. 2018-117350.
(Continued)

*Primary Examiner* — Son T Dinh
(74) *Attorney, Agent, or Firm* — SGPatents PLLC

(57) ABSTRACT

There is provided, for example, a write assist circuit for controlling the voltage level of a memory cell power supply line coupled to an SRAM memory cell to be written in the write operation. The write assist circuit reduces the voltage level of the memory cell power supply line to a predetermined voltage level, in response to a write assist enable signal that is enabled in the write operation. At the same time, the write assist circuit controls the reduction speed of the voltage level of the memory cell power supply line, according to the pulse width of a write assist pulse signal. The pulse width of the write assist pulse signal is defined in such a way that the greater the number of rows (or the longer the length of the memory cell power supply line), the greater the pulse width.

12 Claims, 25 Drawing Sheets

Related U.S. Application Data continuation of application No. 15/629,489, filed on Jun. 21, 2017, now Pat. No. 9,984,743, which is a continuation of application No. 15/214,253, filed on Jul. 19, 2016, now Pat. No. 9,721,648, which is a continuation of application No. 14/547,121, filed on Nov. 18, 2014, now Pat. No. 9,424,910, which is a continuation of application No. 13/610,859, filed on Sep. 12, 2012, now Pat. No. 8,908,418.

(58) Field of Classification Search
USPC .................................... 365/63, 189.16, 226
See application file for complete search history.

(56) References Cited

U.S. PATENT DOCUMENTS

| | | |
|---|---|---|
| 6,977,858 B2 | 12/2005 | Osada et al. |
| 7,324,368 B2 | 1/2008 | Wang et al. |
| 7,408,218 B2 | 8/2008 | Akiyama et al. |
| 7,502,275 B2 | 3/2009 | Nii et al. |
| 7,577,014 B2 | 8/2009 | Yamagami |
| 7,692,943 B2 | 4/2010 | Osada et al. |
| 7,693,004 B2 | 4/2010 | Tsukude |
| 7,864,617 B2 | 1/2011 | Kenkare |
| 8,009,500 B2 | 8/2011 | Nii et al. |
| 8,908,418 B2 | 12/2014 | Yabuuchi |
| 9,424,910 B2 | 8/2016 | Yabuuchi |
| 10,199,096 B2 * | 2/2019 | Yabuuchi .............. G11C 11/419 |
| 2004/0125676 A1 | 7/2004 | Osada et al. |
| 2008/0094900 A1 | 4/2008 | Nakamura et al. |
| 2011/0074464 A1 | 3/2011 | Gunaratna et al. |

FOREIGN PATENT DOCUMENTS

| | | |
|---|---|---|
| JP | 2002-042476 A | 2/2002 |
| JP | 2002-298585 A | 10/2002 |
| JP | 2007-004960 A | 1/2007 |
| JP | 2007-234126 A | 9/2007 |
| JP | 2008-210443 A | 9/2008 |
| JP | 2009-020957 A | 1/2009 |
| JP | 2009-252256 A | 10/2009 |
| TW | 200425144 A | 11/2004 |
| TW | 200527656 A | 8/2005 |

OTHER PUBLICATIONS

Office Action, dated Apr. 25, 2017, in Japanese Patent Application No. 2016-158543.
Office Action, dated May 11, 2017, in Taiwanese Patent Application No. 105126228.
Office Action, dated Sep. 30, 2014, in Japanese Patent Application No. 2011-207674.
Office Action, dated Jun. 28, 2019, in Taiwanese Patent Application No. 107121562.

* cited by examiner

<CONFIGURATION WITH LARGE NUMBER OF ROWS>

<CONFIGURATION WITH SMALL NUMBER OF ROWS>

<LATERALLY LONG CONFIGURATION>

<LONGITUDINALLY LONG CONFIGURATION>

<LATERALLY LONG CONFIGURATION>

<LONGITUDINALLY LONG CONFIGURATION>

US 10,672,463 B2

SEMICONDUCTOR DEVICE

CROSS-REFERENCE TO RELATED APPLICATIONS

The disclosure of Japanese Patent Application No. 2011-207674 filed on Sep. 22, 2011 including the specification, drawings and abstract is incorporated herein by reference in its entirety.

BACKGROUND

The present invention relates to a semiconductor device, and more particularly to a technology that is effective in the application of semiconductor devices including a memory unit such as SRAM.

For example, Japanese Unexamined Patent Publication No. 2007-4960 discloses a configuration for reducing the voltage level of a cell power supply line when data is written in SRAM. Japanese Unexamined Patent Publication No. 2009-252256 discloses a configuration for reducing the voltage level of a selected word line in SRAM. Japanese Unexamined Patent Publication No. 2008-210443 discloses a configuration for supplying the power voltage level of a memory cell to a power supply node of a word line driver in the rise of the word line, and for supplying a voltage level, which is lower than the power voltage level of the memory cell, to the power supply node of the word line driver after the rise of the word line.

SUMMARY

For example, with the miniaturization of semiconductor devices including a static random access memory (SRAM) memory Module or other media, voltage scaling is generally, performed from the point of view of reliability, power consumption, and the like. However, when the semiconductor devices become small, there is a problem that the operation margin of the SRAM memory cell is reduced as a result of increased fluctuations in production or other factors. Thus, it is necessary to implement various measures to maintain a constant operation margin at a low voltage.

FIGS. 24A and 24B show a semiconductor device subject to the present invention, in which FIG. 24A is a schematic diagram of a configuration and operation example of the main part of a static memory module of the semiconductor device, and FIG. 24B is a schematic diagram of a configuration and operation example different from the example shown in FIG. 24A. The static memory module shown in FIGS. 24A and 24B includes a memory array MARY, a word driver block WLD, and a write assist circuit WAST'. In MARY, there are provided a word line WL that is devein by WLD and extends in the X-axis direction, a memory cell (SRAM memory cell) MC selected by WL, and a memory cell power supply line driven by WAST'. The memory cell power supply line extends in the Y-axis direction and supplies a memory cell power supply voltage ARVDD to the particular MC. WAST' has a function for reducing ARVDD of the selected memory cell MC for a predetermined time in the write operation. In this way, the information retention capability (latch capability) is reduced, namely, the static noise margin (SNM) is reduced. As a result, the particular MC can be easily rewritten (the write margin increases).

Here, MARY shown in FIG. 24A has a laterally long shape in which the Y-axis direction (the extension direction of the memory cell power supply line (ARVDD) or the extension direction of the bit line not shown) is the longitudinal direction, and the X-axis direction (the extension direction of WL) is the lateral direction. MARY shown in FIG. 24B has a longitudinally long shape, different from the case of FIG. 24A. For example, it is assumed that WAST' is designed to reduce the voltage level of ARVDD at the optimum conditions with respect to MARY shown in FIG. 24A. In this case, when the particular WAST' is applied to MARY shown in FIG. 24B, the load of the memory cell power supply line (ARVDD) of MARY is larger in FIG. 24B than in FIG. 24A. Thus, it could take time for the voltage level of the ARVDD to reach a desired level. During this time, the selected MC has a relatively high information retention capability (latch capability), namely, a large SNM. As a result, the particular MC may not be easily written. In other words, the write margin may be reduced.

FIG. 25A is a schematic diagram of a configuration and operation example of the main part of the static memory module in the semiconductor device subject to the assumption of the present invention. FIG. 25B is a schematic diagram of a configuration and operation example that is different from the example shown in FIG. 25A. The static memory module in FIGS. 25A and 25B includes a memory array MARY, a word driver block WLD, and a word driver power supply circuit block VGEN'. In MARY, there are provided a word line WL that is driven by WLD and extends in the X-axis direction, a memory cell (SRAM memory cell) MC selected by the particular WL, and a word driver power supply line driven by VGEN'. The word driver power supply line extends in the Y-axis direction and supplies a word driver power supply voltage WLVDD to each word driver of WLD.

When a predetermined WL is activated by WLD, VGEN' reduces the power supply voltage WLVDD (of a word driver) of the particular WLD for a predetermined time. With this function, it is possible to increase the information retention capability (latch capability) of MC holding information on the particular WL. As a result, the read margin, and the like, can be increased. In other words, as the drive capability of an access NMOS transistor in the SRAM memory cell is equivalently reduced, it is possible to increase the so-called β ratio, which is the ratio of the drive capability of the access NMOS transistor to the drive capability of the driver NMOS transistor in the SRAM memory cell. Thus, the static noise margin (SNM) can be increased.

Here, MARY shown in FIG. 25A has a laterally long shape in which the Y-axis direction (the extension direction of the word driver power supply line (WLVDD) or the extension direction of the bit line not shown) is the longitudinal direction, and the X-axis direction (the extension direction of WL) is the lateral direction. MARY shown in FIG. 25B has a longitudinally long shape, unlike the case of FIG. 25A. The load of the word driver power supply line (WLVDD) of the MARY in FIG. 25A is smaller than that in FIG. 25B, so that the voltage level of WLVDD is rapidly reduced. As a result, the voltage level of WLVDD may not be enough for WL to rise rapidly. Further, the load of WL in MARY shown in FIG. 25A is larger than that in FIG. 25B, so that it is difficult to increase the rate of rise of WL. As a result, it would be more difficult to increase the rate of rise because of the synergistic effect of the WLVDD described above. For this reason, in MARY shown in FIG. 25A, the access time may not be long enough with the delay in the rate of rise of WL.

On the other hand, the load of the word driver power supply line (WLVDD) in MARY in FIG. 25B is larger than that in FIG. 25A, so that it could take time for the voltage level of WLVDD to be reduced to a desired level. During this time, the voltage level of the selected MC is relatively high. Then, MC over the particular WL has a relatively low static noise margin (SNM). As a result, the read margin of the particular MC could be reduced. In addition, the load of WL in MARY shown in FIG. 25B is smaller than that in the MARY in FIG. 25A, so that the rate of rise is likely to increase. In other words, the voltage of WL is likely to increase due to the overshoot. As a result, the reduction in the static noise margin (SNM) would further be accelerated because of the synergistic effect of WLVDD. Thus, it may be difficult to obtain a sufficient read margin in MARY shown in FIG. 25B.

As described above, when the memory arrays with different shapes, such as the longitudinally long shape and the laterally long shape, are present in the semiconductor device, there may be a reduction in the operation margin (read margin, write margin) and a delay in the access time depending on the shape of the memory array. In particular, when a compiled SRAM and the like is mounted over the semiconductor device such as system-on-a-chip (SOC), there may be a case in which a large number of SRAM memory modules with different shapes are mounted over SOC according to the product market demands. In such a case, it is found that the operation margin and the access time can be a significant problem. Note that the compiled SRAM is a macro cell that is automatically generated by an automatic design tool, for example, by specifying the number of bit lines or the number of word lines. In the compiled SRAM, the memory allays and the peripheral circuits are formed by automatically arranging the layout of various circuit components (for example, word drivers or other components) by the automatic design tool for the number of bit/word lines.

The present invention has been made in the light of the above problem. Accordingly, an object of the present invention is to increase the operation margin of a semiconductor device including a plurality of static memory modules. Other objects and novel features of the present invention will be apparent from the following detailed description when read in conjunction with the appended claims and the drawings attached hereto.

An outline of a typical embodiment of the invention disclosed in this application will be simply described below.

A semiconductor device according to the exemplary embodiment of the present invention includes a first memory module and a second memory module. The first memory module includes a plurality of first word lines, a plurality of first bit lines, and a plurality of first SRAM memory cells located at the intersections of the first word lines and the first bit lines. In addition, the first memory module also includes a plurality of first memory cell power supply lines extending in the same direction as the first bit lines to supply power to the first SRAM memory cells, as well as a first write assist circuit. The first write assist circuit discharges the electric charge of a first memory cell power supply line corresponding to the first SRAM memory cell to be written in the write operation for a first period. Similarly, the second memory module includes a plurality of second word lines, a plurality of second bit lines, and a plurality of second SRAM memory cells located at the intersections of the second word lines and the second bit lines. In addition, the second memory module also includes a plurality of second memory cell power supply lines extending in the same direction as the second bit lines to supply power to the second SRAM memory cells, as well as a second write assist circuit. The second write assist circuit discharges the electric charge of a second memory cell power supply line corresponding to the second SRAM memory cell to be written in the write operation for a second period. Here, when the number of first word lines is greater than the number of second word lines, the first period is set to be longer than the second period.

With this configuration, it is possible to reduce the power supply voltage of the SRAM memory cell to be written in the write operation. Thus, the write margin can be increased. In addition, the reduction speed (and the reduction width) of the particular power supply voltage can be controlled by the first and second periods. Thus, the write margin can be increased regardless of the number of word lines of each memory module.

Further, the semiconductor device according to the embodiment of the present invention, the first memory module described above also includes a plurality of first word drivers, a word driver power supply line, and a first power supply circuit block. The second memory module described above also includes a plurality of second word drivers, a second word driver power supply line, and a second power supply circuit block. The first word drivers drive the first word lines. The first word driver power supply line extends in the same direction as the first bit line to supply power to the first word drivers. The first power supply circuit block reduces the voltage level of the first word driver power supply line by a first drive capability in the read operation. Similarly, the second word drivers drive the second word lines. The second word driver power supply line extends in the same direction as the second bit line to supply power to the second word drivers. The second power supply circuit block reduces the voltage level of the second word driver power supply line by a second drive capability in the read operation. Here, the first and second drive capabilities are defined in such a way that the greater the number of words lines or the smaller the number of bit lines, the greater the first and second drive capabilities. In other words, when the number of the first word lines and the number of the second word numbers are substantially the same, and when the number of the first bit lines is greater than the number of the second bit lines, the first drive capability is set to be smaller than the second drive capability. Further, when the number of the first bit lines and the number of the second bit lines are substantially the same, and when the number of the first word lines is greater than the number of the second word lines, the first drive capability is set to be larger than the second drive capability.

With this configuration, it is possible to reduce the voltage level of the selected word line in the read operation. Thus, it is possible to increase the read margin of the SRAM memory cell over the particular word line. Further, it is also possible to control the reduction speed (and the reduction width) of the particular voltage level by the first and second drive capabilities. As a result, the write margin can be increased, while maintaining a predetermined access performance, regardless of the number of word lines and the number of bit lines in each memory module.

The effects obtained by a typical embodiment of the invention disclosed in this application will be briefly described below. That is, in a semiconductor device including a plurality of static memory modules, it is possible to increase the operation margin.

DETAILED DESCRIPTION

Figure 1:
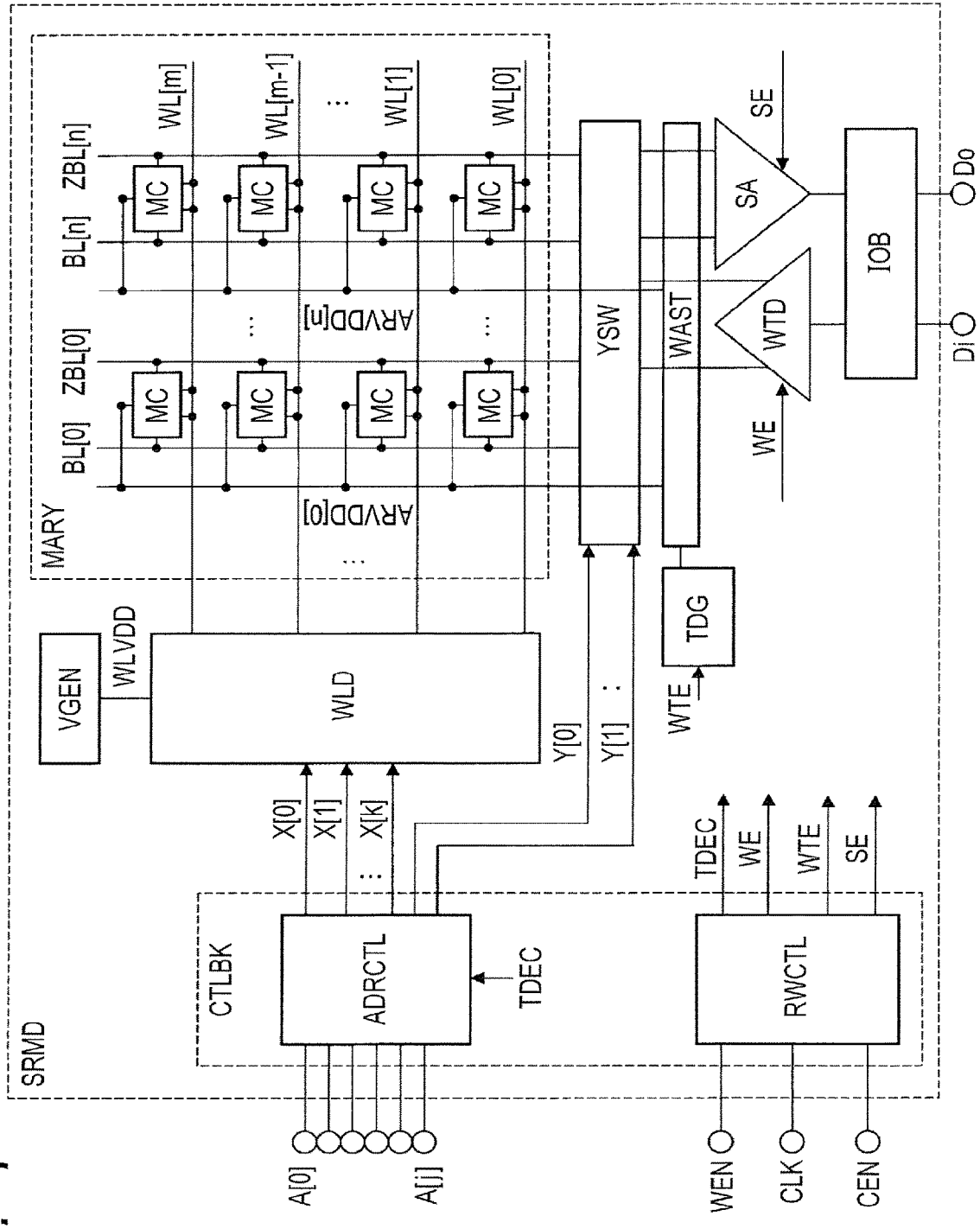
FIG. 1 is a block diagram of a schematic configuration example of a static memory module included in a semiconductor device according to a first embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including the number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not necessarily required unless otherwise stated or except the case where the components are apparently necessary in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Still further, the circuit device including each functional block of the embodiments is not particularly limited, but is formed by the known integrated circuit technology such as a complementally MOS transistor (CMOS) over a semiconductor substrate such as of mono-crystal silicon. Note that in the embodiments, as an example of metal insulator semiconductor field effect transistor (MISFET), which is simply referred to as MIS transistor, a metal oxide semiconductor field effect transistor (MOSFET), which is simply referred to as MOS transistor, is used. However, the non-oxide film is not excluded as a gate insulating film. In the drawings, the gate of a p-channel MOS transistor (PMOS transistor) is represented by a circle to distinguish it from an n-channel MOS transistor (NMOS transistor). Although the coupling of the substrate potential of the MOS transistor is not shown in the drawings, the coupling method is not particularly limited within the range of normal operation of the MOS transistor.

Hereinafter, the embodiments of the present invention will be described in detail with reference to the accompanying drawings. In principle, like components are denoted by like reference numerals throughout the drawings for describing the embodiments, and the explanation is not repeated.

First Embodiment

<Schematic Configuration of the Entire Memory Module>

FIG. 1 is a block diagram of a schematic configuration example of a static memory module included in a semiconductor device according to a first embodiment of the present invention. A static memory module SRMD in FIG. 1 includes a control circuit block CTLBK, a word driver block WLD, a word driver power supply circuit block VGEN, a memory array MARY, column selection circuit YSW, a write driver WTD, a write assist circuit WAST, a sense amplifier SA, a write assist timing generation circuit TDG, and an input/output buffer circuit IOB. CTLBK includes an address control circuit ADRCTL and a read/write control circuit RWCTL.

MARY includes (m+1) word lines WL [0] to WL [m] extending in parallel in a first direction, (n+1) bit line pairs (BL [0], ZBL [0]) to (BL [n], ZBL [n]) extending in parallel in a second direction crossing the first direction, and a plurality of memory cells MC located at the intersections of the (m+1) word lines and the (n+1) bit line pairs. Each bit line pair includes two bit lines (for example, BL [0] and ZBL [0]) for transmitting complementary signals. Further, MARY also includes (n+1) memory cell power supply lines (memory cell power supply voltages) ARVDD [0] to ARVDD [n] extending in parallel in the second direction. The MC coupled to a certain bit line pair (BL [s], ZBL [s]) (s is an integer of 0 to n) is coupled to a corresponding ARVDD [s].

The address control circuit ADRCTL decodes (or predecodes) address signals A [0] to A [j] from an external address terminal of SRMD with a decode start signal TDEC as the trigger. Then, ADRCTL outputs row selection signals X [0] to X [k] as well as column selection signals Y [0] to Y [i]. The word driver block WLD selects (or activates) one of the (m+1) word lines according to the signals X [0] to X [k]. The column selection circuit YSW selects one of the (n+1) bit line pairs according to the signals Y [0] to Y [i]. The word driver power supply circuit block VGEN supplies the word driver power supply voltage WLVDD to each word driver (not shown) in WLD.

The read/write control circuit RWCTL generates a decode start signal TDEC, an internal write enable signal WE, a write assist enable signal WTE, and a sense amplifier enable signal SE, in response to the signals (WEN, CLK, CEN) from an external control terminal of SRMD. WEN is the write enable signal that distinguishes between read and write commands. CLK is the clock signal as the base of the read write operation. CEN is the clock enable signal for controlling enable/disable clock signals. The input/output buffer circuit IOB obtains a data input signal Di from an external data terminal of SRMD, and transmits Di to the write driver WTD. Further, IOB obtains the output signal from the sense amplifier SA, and outputs it as a data output signal Do to the external data terminal.

WTD amplifies the difference of the voltages of the data from the IOB according to the internal write enable signal WE, and transmits to a predetermined bit line pair through the column selection circuit YSW. In response to the write assist enable signal WTE, the write assist timing generation circuit TDG outputs a control signal to the write assist circuit WAST. WAST controls the memory cell power supply voltage ARVDD of the selected memory cell MC by using the control signal from TDG in the write operation. Although the details will be described later, the part of the TDG and WAST is one of the main characteristics of the first embodiment. The sense amplifier SA amplifies the difference between the voltages of the signal pair, which is transmitted from the predetermined bit line pair through YSW, with the sense amplifier enable signal SE as the trigger. Then, the sense amplifier SA outputs the result to the IOB.

Figure 2:
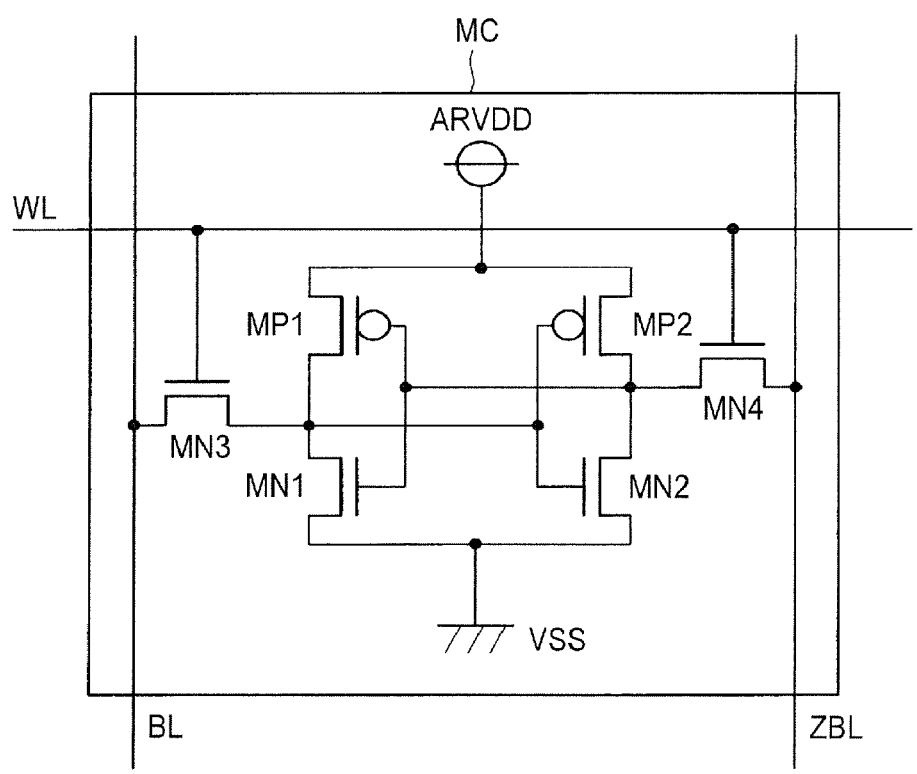
FIG. 2 is a circuit diagram of a configuration example of each memory cell in the memory module in FIG. 1.

FIG. 2 is a circuit diagram of a configuration example of each memory cell in the memory module in FIG. 1. The memory cell MC shown in FIG. 2 is the SRAM memory cell including four NMOS transistors MN1 to MN4, two PMOS transistors MP1 and MP2. Here, MN1 and MN2 are driver transistors, MN3 and MN4 are access transistors, and MP1 and MP2 are load transistors. The gate of MN3 is coupled to the word line WL, in which one end of the source/drain is coupled to the bit line BL on the positive side. The gate of MN4 is coupled to WL, in which one end of the source/drain is coupled to the bit line ZBL on the negative side.

Each pair of transistors, MN1, MP1 and MN2, MP2, forms a CMOS inverter circuit between the memory cell power supply voltage ARVDD and the ground power supply voltage VSS. In the two CMOS inverter circuits, one input is coupled to the other output to form a latch circuit. The other end of the source/drain of MN4 is coupled to the input (the output of the CMOS inverter circuits (MN2, MP2) of the CMOS inverter circuit (MN1, MP1). The other end of the source/drain of MN3 is coupled to the input (the output of the CMOS inverter circuit (MN1, MP1) of the CMOS inverter circuit (MN2, MP2).

<Schematic Operation of the Entire Memory Module>

Figure 3:
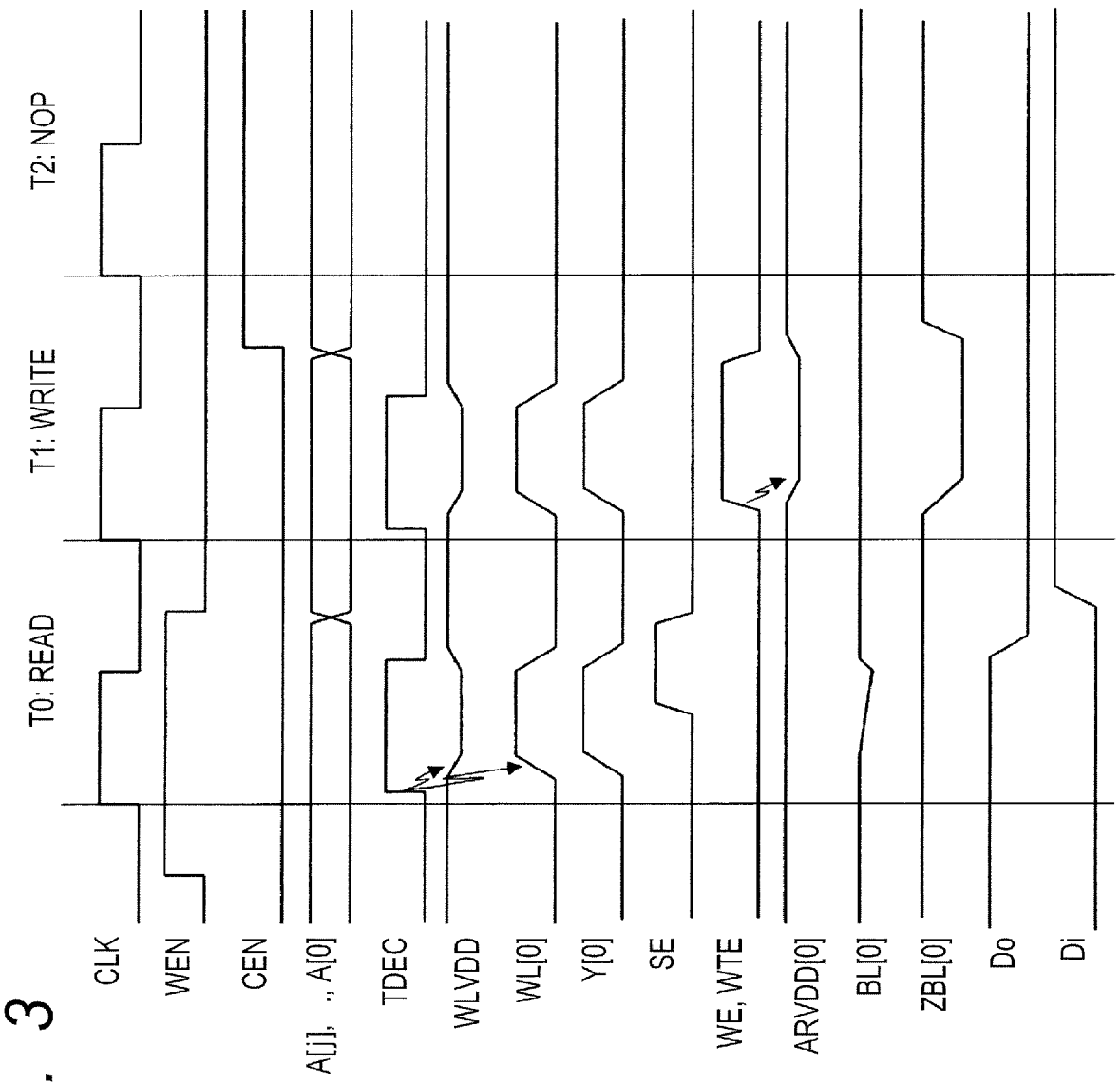
FIG. 3 is a waveform diagram of a schematic operation example of the memory module in FIG. 1.

FIG. 3 is a waveform diagram of a schematic operation example of the memory module in FIG. 1. In the example shown in FIG. 3, when the clock signal CLK rises, a read cycle (T0) is performed when the clock enable signal CEN is at 'L' level and the write enable signal WEN is at 'H' level. Further, a write cycle (T1) is performed when CEN is at the 'L' level and WEN is also at the 'L' level. Further, when CEN is at the 'H' level upon the rise of the CLK, it changes to a no-operation cycle (T2) in which the read and write operations are not performed.

In the read cycle (T0), first, the write control circuit RWCTL changes the decode start signal TDEC from the 'L' level to the 'H' level, upon the rise of the clock signal CLK. Further, RWCTL outputs the 'L' level as the internal write enable signal WE as well as the write assist enable signal WTE. When TDEC is changed to the 'H' level, the address control circuit ADRCTL generates the row selection signals X [0] to X [k] and the column selection signals Y [0] to Y [i] (here, Y [0] is displayed in FIG. 3), according to the address signals A [0] to A [j]. In the example shown in FIG. 3, it is assumed that the word line WL [0] is selected by X [0] to X [k], and the bit line pair (BL [0], ZBL [0]) is selected by Y [0] to Y [i].

The word driver block WLD raises WL [0] according to X [0] to X [k]. Then, the storage data of each memory cell MC coupled to WL [0] is read on the corresponding bit line pair. In this example, the write signal in the bit line pair, BL [0] and ZBL[0], is transmitted to the sense amplifier SA through the column selection circuit YSW. The read/write control circuit RWCTL changes the sense amplifier enable signal SE to the enable state ('H' level) when a predetermined delay time has elapsed after the transition of the TDEC to the 'H' level. SA amplifies the read signal of the bit line pair (BL[0], ZBL[0]) transmitted through YSW, with the 'H' level of the particular SE as the trigger. Then, the amplified signal is output to the external terminal as the data output signal Do through the input/output buffer circuit IOB. Here, the raised word line WL [0] is lowered from the 'H' level to the 'L' level of TDEC.

Here, the word driver power supply circuit block VGEN reduces the word driver power supply voltage WLVDD to a predetermined voltage level, in response to the 'H' level of TDEC in the read operation. For example, the word driver power supply circuit block VGEN reduces the voltage level of WLVDD to a voltage level lower than the voltage level of the memory cell power supply voltage ARVDD. The voltage level of the selected word line (WL [0]) is defined according to the voltage level of the particular WLVDD. In each MC coupled onto WL [0], the static noise margin (SNM) increases with the increase in the β ratio of the driver transistor and the access transistor. Thus, the write margin increases. Then, VGEN returns the voltage level of WLVDD to the original voltage level (for example, the voltage level of ARVDD), in response to the 'L' level of TDEC herein.

Next, in the write cycle (T1), first the read/write control circuit RWCTL changes the decode start signal TDEC from the 'L' level to the 'H' level, upon the rise of the clock signal CLK. Further, RWCTL outputs the 'H' level as the internal write enable signal WE as well as the write assist enable signal WTE. The address control circuit ADRCTL generates the row selection signals X [0] to X [k] and the column selection signals Y [0] to Y [i], when TDEC is changed to the 'H' level. The word driver block WLD raises the word line (here, WL [0]) corresponding to X [0] to X [k].

In parallel with this, the data input signal Di from the external terminal is input to the write driver WTD through the input/output buffer circuit IOB. WTD amplifies the input signal from IOB, in response to the 'H' level of the WE. The column selection circuit YSW couples the output of the WTD to the bit line pair (here, LB [0] and ZBL [0]). In this way, the information of Di is written into the selected memory cell MC. Then, the raised word line (WL [0]) is lowered when the TDEC is changed from the 'H' level to the 'L' level. Thus, the selected memory cell MC holds the information of Di.

Here, in this write operation, the write assist circuit WAST receives the 'H' level of the write assist enable signal WTE through the write assist timing generation circuit TDG. Then, the write assist circuit WAST reduces the memory cell power voltage to be written (here, ARVDD [0]) to a predetermined voltage level. Thus, in the memory cell to be written (here, MC located at the intersection of WL [0] and BL [0], ZBL [0]), the static noise margin (SNM) is reduced as the drive capability of the driver transistor decreases. As a result, the write margin increases. Then, WAST returns the voltage level of WLVDD to the original voltage level (for example, the voltage level of ARVDD) in response to the 'L' level of the voltage level of WLVDD. Note that in such a write operation, the word driver power supply circuit block VGEN reduces the word driver power supply voltage WLVDD to a predetermined voltage level, similarly to the case of the write operation described above. This ensures that the memory cell not to be written over the selected word line (WL [0]) holds the storage data to increase SNM (read margin).

<Schematic Configuration of the Entire Semiconductor Device>

Figure 4:
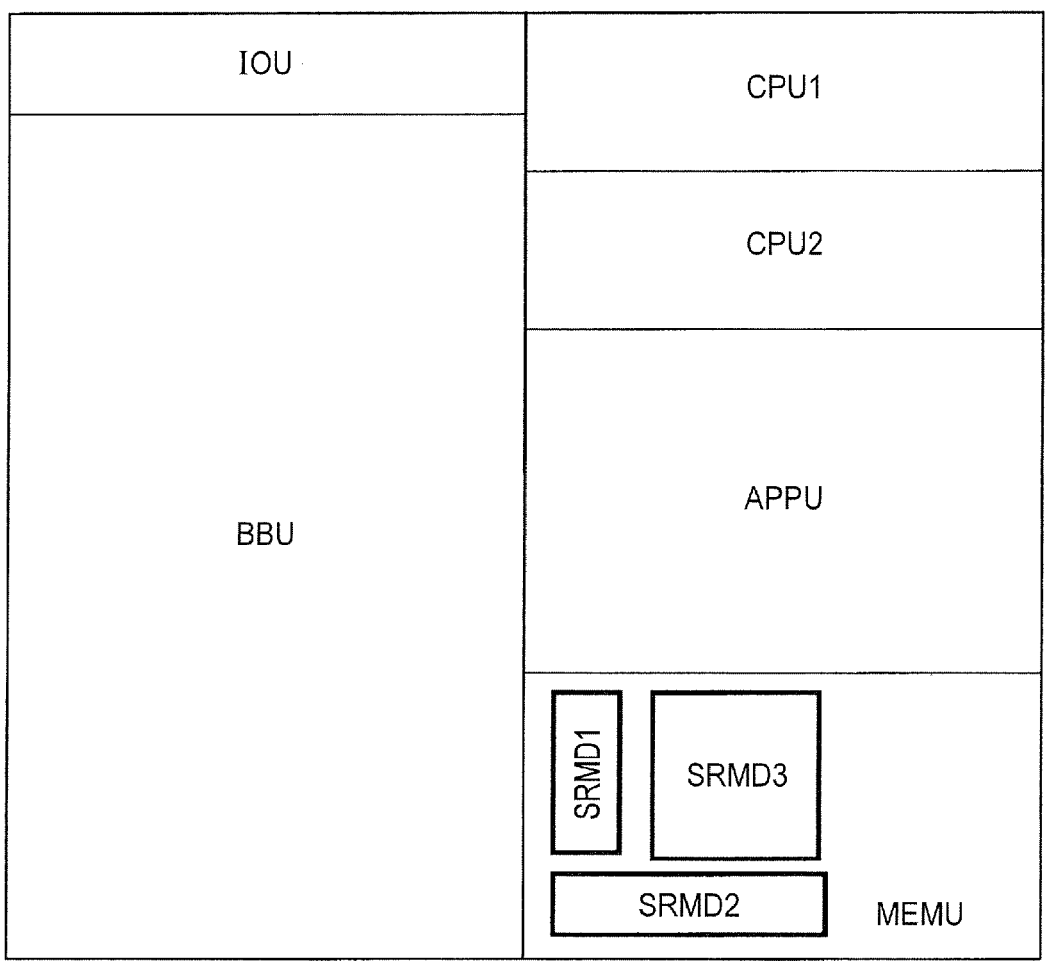
FIG. 4 is a block diagram of a schematic configuration example of the entire semiconductor device according to the first embodiment of the present invention.

FIG. 4 is a block diagram of a schematic configuration example of the entire semiconductor device according to the first embodiment of the present invention. In FIG. 4, it is shown a semiconductor device (LSI) such as called system-on-a-chip (SOC) in which various logic circuits and memory circuits are formed in one semiconductor chip. The semiconductor device in FIG. 4 is, for example, the LSI for mobile phones. The semiconductor device includes two processor units CPU1 and CPU2, an application unit APPU, a memory unit MEMU, a baseband unit BBU, and an input/output unit IOU. MEMU includes a plurality of (here, three) static memory modules SRMD1 to SRMD3. The static memory modules SRMD1 to SRMD3 are different in the array configuration (the number of rows (word lines) and the number of columns (bit line pairs)). The configuration example shown in FIG. 1 is applied to each of the memory modules.

CPU1 and CPU2 perform arithmetic operations based on a program. APPU performs a predetermined application process required for the mobile phone. BBU performs a predetermined baseband process associated with wireless communications. IOU serves as an input/output interface between inside and outside. Here, each of SRMD1 to SRMD3 in MEMU is accessed, for example, as a cache memory in the process of the various circuit blocks. The optimal configuration of the cache memory (the number of rows and the bit width) can be changed according to the configuration and process of the circuit blocks. Accordingly, the array configuration of each memory module can also be changed. Thus, as shown in FIG. 4, the semiconductor device may include memory modules having various array configurations, such as the longitudinally long configuration (SRMD1), laterally long configuration (SRMD2), and substantially rectangular configuration (SRMD3). Although not particularly limited, the optimal array configuration is determined by selecting the number of rows (for example, in the range of 8 to 512) and the number of columns (for example, in the range of 16 to 512) accordingly.

Each memory module in the semiconductor device is automatically generated, for example, by specifying the number of rows and the number of columns to an automatic design tool called a memory compiler. The generated memory module is called a complied SRAM and the like as described above. The compiled SRAM is automatically generated by using the layout of the various circuit components (for example, word drivers and the like) that are defined in advance. Thus, it is difficult to optimize the drive capability (transistor size) of the circuit components (for example, word drivers and the like) for each memory module according to the array configuration. The semiconductor device may include ten or more complied SRAMs. In this case, in particular, the optimization may be more difficult for each memory module. This would result in the reduction in the operation margin (read margin, write margin) as well as the delay in the access time, according to the array configuration as described with reference to FIGS. 24A, 24B, 25A and 25B.

<Outline of the Write Assist Circuit (Main Characteristics of the First Embodiment)>

Figure 5:
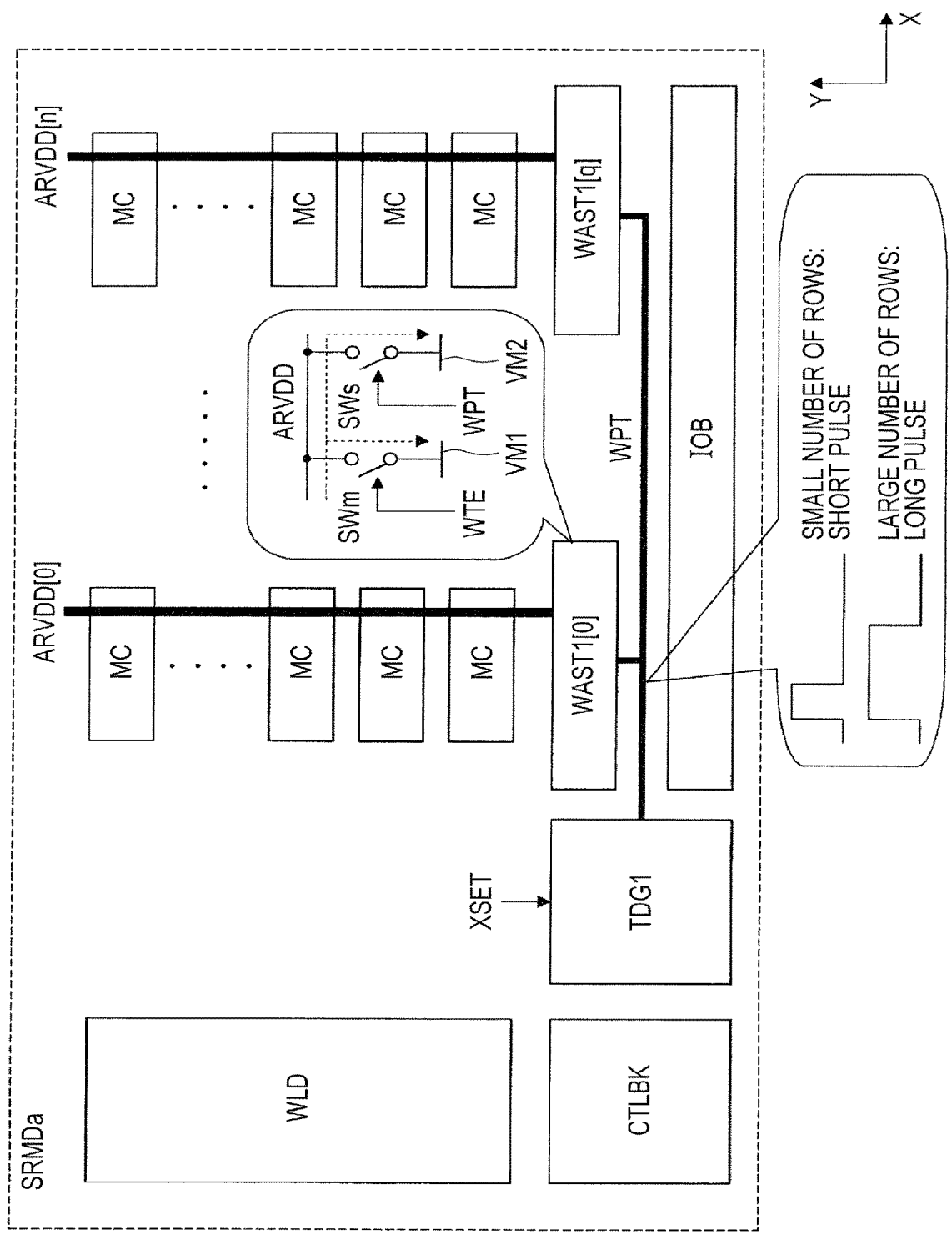
FIG. 5 is a schematic diagram of an example of the function around the write assist circuit of the memory module in FIG. 1.

FIG. 5 is a schematic diagram of an example of the function around the write assist circuit of the memory module in FIG. 1. In FIG. 5, a static memory module SRMDa typically includes a word driver WLD, a control circuit block CTLBK, a write assist timing generation circuit TDG1, an input/output buffer IOB, write assist circuits WAST1 [0] to WAST1 [q], and a plurality of memory cells MC. WAST1 [0] controls the memory cell power supply voltage ARVDD [0]. WAST1 [q] controls the memory cell power supply voltage ARVDD [n]. Information of the number of rows XSET is provided in the write assist timing generation circuit TDG1 in advance. XSET is the digital code representing the number of word lines included in the particular SRMDa. The method of providing XSET is not particularly limited, and XSET may be embedded into the circuit in advance, or may be stored in a register, and the like, and loaded from a nonvolatile memory or other media when the semiconductor device is initialized. TDG1 outputs a write assist pulse signal WPT. At this time, the larger the number of rows is set by XSET, the wider the pulse width.

When the write operation is performed with respect to the memory cell MC coupled to ARVDD [0], WAST1 [0] turns on a switch SWm to reduce the voltage level of ARVDD [0] to a predetermined voltage level VM1, according to the write assist enable signal WTE. Further, when the voltage level of ARVDD [0] is reduced, WAST1 [0] turns on a switch SWs in the pulse time of WPT to temporarily discharge the electric charge of ARVDD [0] to a voltage level VM2 (for example, the voltage level below VM1). Thus, the reduction speed of the voltage level is controlled. Similarly, when the write operation is performed with respect to the memory cell MC coupled to ARVDD [n], WAST1 [q] turns on the switch SWm to reduce the voltage level of the ARVDD [n] to VM1, according to WTE. Further, when the voltage level of ARVDD [n] is reduced, WAST1 [q] turns on SWs in the pulse time of WPT to control the reduction speed of the voltage level.

Figure 6:
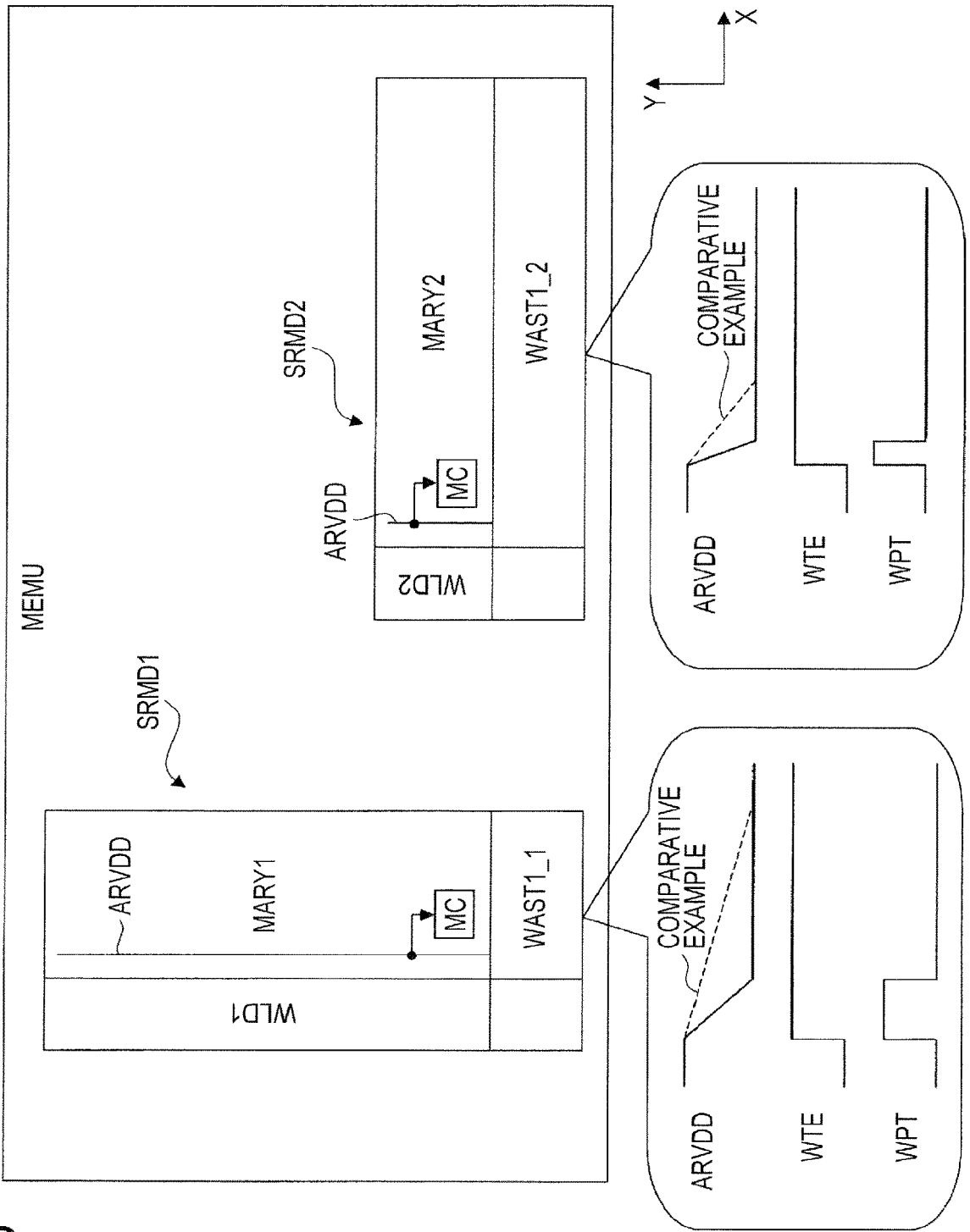
FIG. 6 is a schematic diagram of an example of the effect in the memory unit in FIG. 4 when the write assist circuit in FIG. 5 is applied to each static memory module of the particular memory unit.

FIG. 6 is a schematic diagram of an example of the effect in the memory unit in FIG. 4, when the write assist circuit in FIG. 5 is applied to each static memory module of the particular memory unit. In the memory unit MEMU shown in FIG. 6, the extension direction of the word line (not shown) is the lateral direction (X-axis direction), and the extension direction of the bit line (not shown) and the memory cell power supply line ARVDD is the longitudinal direction (Y-axis direction). The memory unit MEMU includes a longitudinally long static memory module SRMD1 and a laterally long static memory module SRMD2. The number of rows in SRMD1 is greater than in SRMD2. In other words, the length of SRMD1 in the Y-axis direction is longer than that of SRMD2. Thus, a write assist pulse signal WPT with a wide pulse width is applied to a write assist circuit WAST1_1 of SRMD1. Then, WPT with a narrow pulse width is applied to a write assist circuit WAS1_2 of SRMD2.

Here, it is assumed that the drive capability of the switch SWm in FIG. 5 is determined according to the minimum number of rows that the memory module can have, and that the number of rows of SRMD2 is slightly greater than the minimum number of rows. In SRMD1 and SRMD2, if the memory cell power supply voltage ARVDD is reduced only by the control of WTE without using WPT (the switch SWs in FIG. 5), the time to reach a predetermined voltage level changes according to the length (the amount of load) of the particular memory cell power supply line as shown in the comparative example shown in FIG. 6. Here, SRMD2 will take more time than SRMD1. As described above, when the time to reach the predetermined time increases, the write margin could be reduced as described with reference to FIG. 24B.

Thus, in the case of SRMD1, the rate of fall of ARVDD is accelerated by WPT with a wide pulse width to significantly reduce the time to reach the predetermined voltage level. In the case of SRMD2, the rate of fall of ARVDD is slightly accelerated by WPT with a narrow pulse width to slightly reduce the particular time. In this way, it is possible to increase the write margin regardless of the array configuration of the memory module. Note that the drive capability of the switch SWm in FIG. 5 is determined, for example, according to the minimum number of rows that the memory module can have, or is set to a lower value. In the former case, when the memory module has the minimum number of rows, for example, it is designed so that the pulse is not input to WPT. In the latter case, for example, it is designed so that the pulse is input to WET even if the memory module has the minimum number of rows.

Further, here, the change in the write margin associated with the array configuration is compensated by changing the pulse width of WPT. However, it is also possible to compensate the change in the write margin by using a circuit configuration in which the switches SWm and SWs shown in FIG. 5 can be changed according to the circumstances. In other words, for example, it is also possible to use a method in which the SWM and SWs include a plurality of switches coupled in parallel to select the number of switches to be used according to the array configuration. However, in this case, it is necessary to use a large number of switches to change the drive capability in a wide range, potentially leading to the increase. This may result in the increase in the circuit area or other areas. From this point of view, it is preferable to use the method of adjusting according to the pulse width of WPT as shown in FIG. 5.

<Details of the Write Assist Circuit>

Figure 7A:
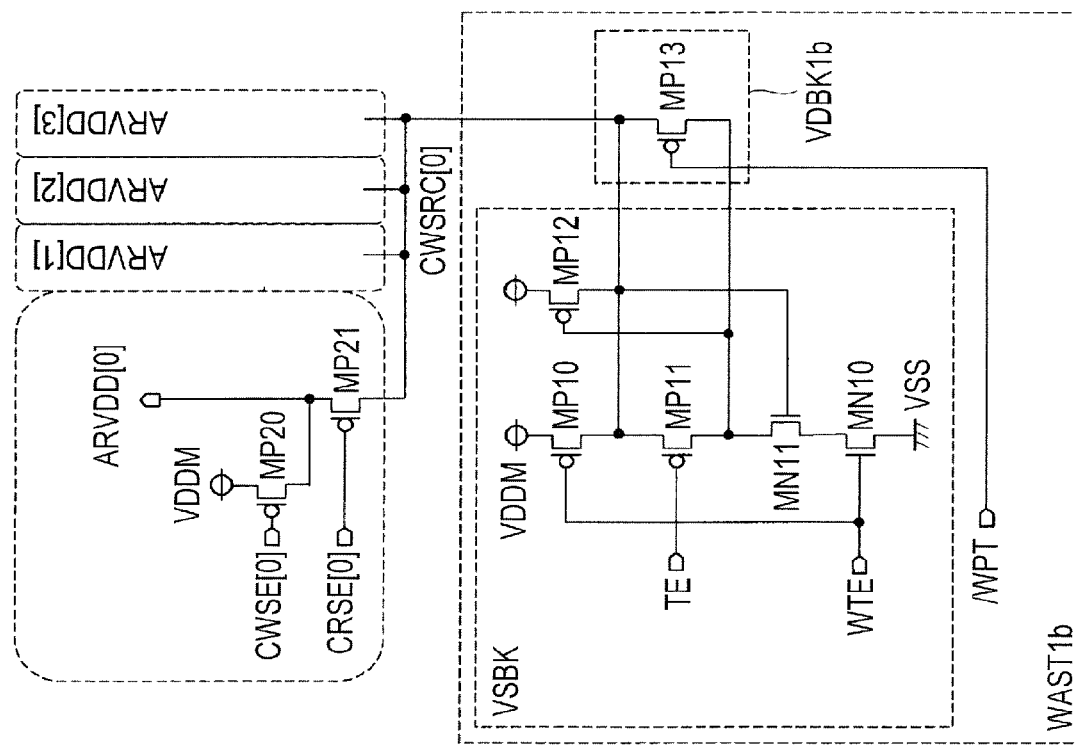
FIG. 7A is a circuit diagram of a detailed configuration example of the write assist circuit in FIG. 5.
Figure 7B:
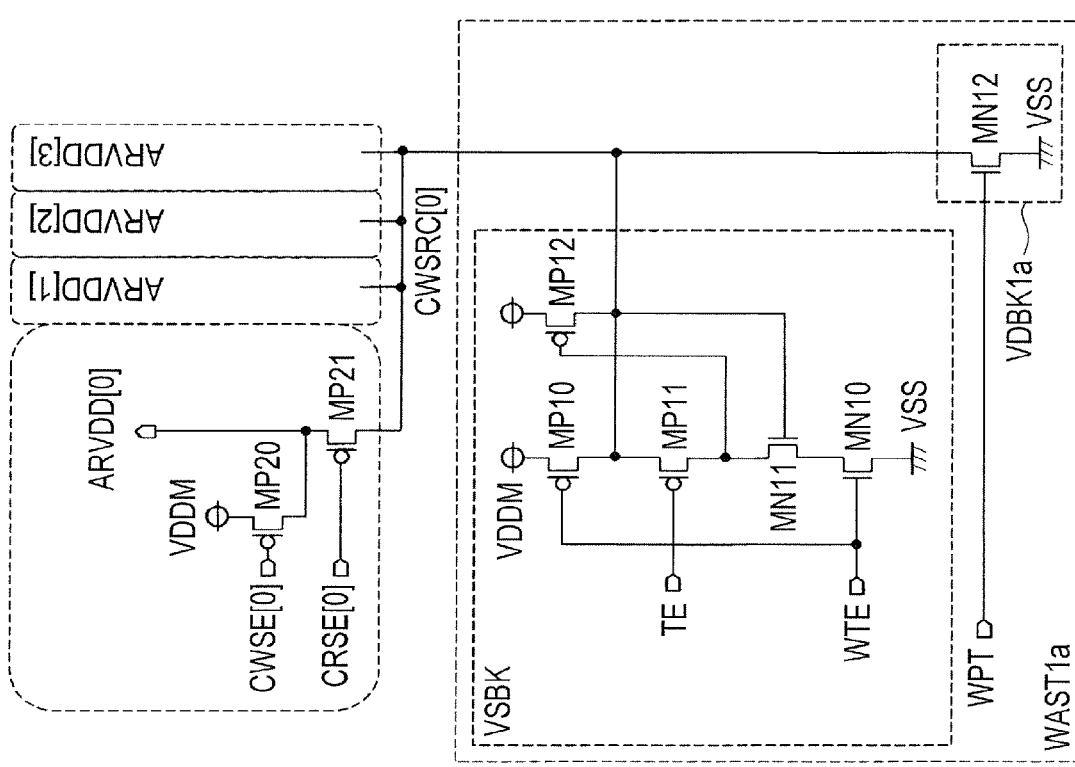
FIG. 7B is a circuit diagram of another configuration example different from the case of FIG. 7A.
Figure 8:
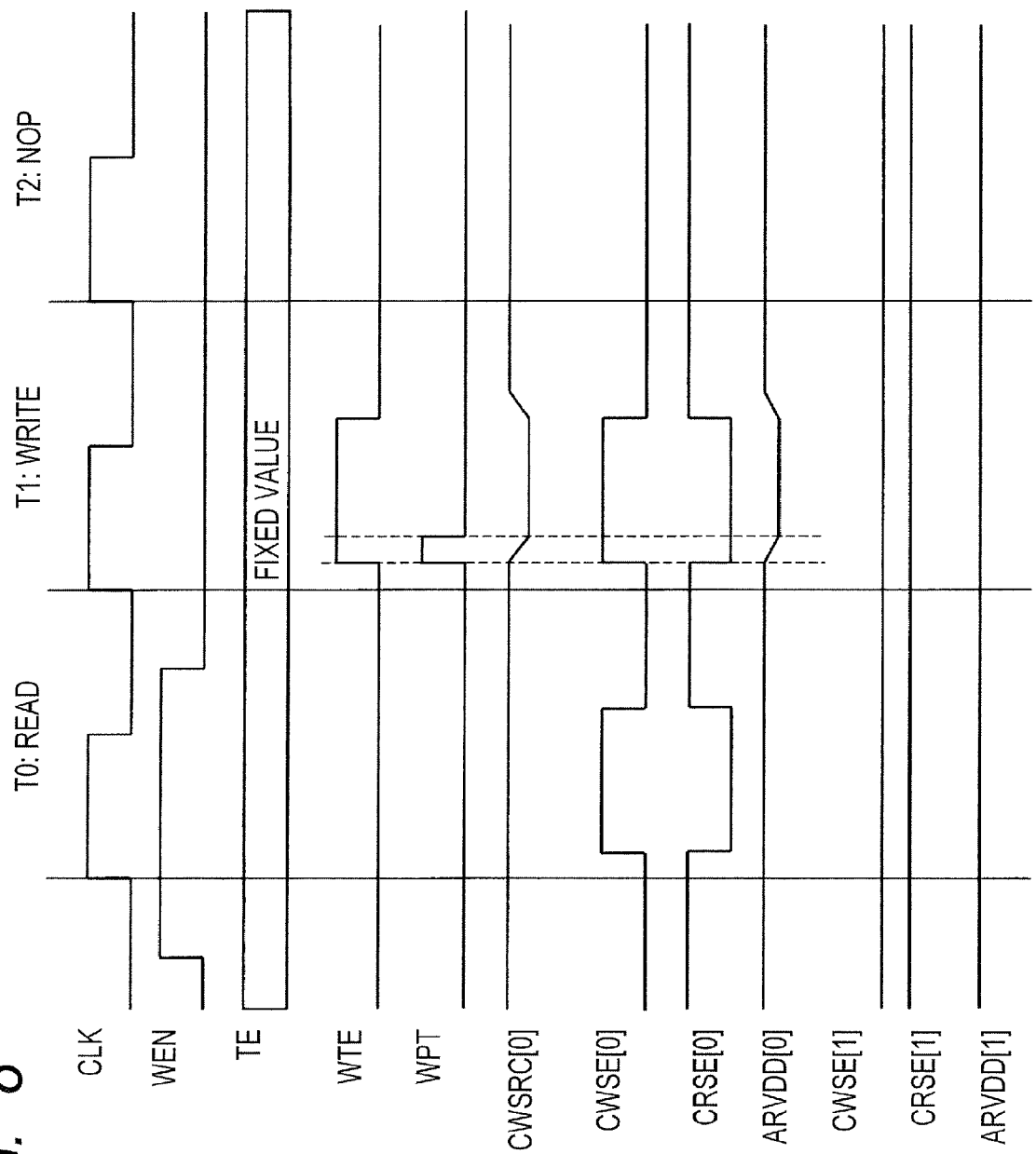
FIG. 8 is a waveform diagram of an operation example of the write assist circuit shown in FIGS. 7A and 7B.

FIG. 7A is a circuit diagram of a detailed configuration example of the write assist circuit in FIG. 5. FIG. 7B is a circuit diagram of another configuration example different from the case of FIG. 7A. FIG. 8 is a waveform diagram of an operation example of the write assist circuit in FIGS. 7A and 7B. First, the write assist circuit WAST1a shown in FIG. 7A includes a static unit VSBK including PMOS transistors MP10 to MP12 and NMOS transistors MN10 and MN11. There is also provided a dynamic unit VDBK1a including an NMOS transistor MN12. VSBK is a circuit for reducing the memory cell voltage level from a certain voltage level to a predetermined voltage level in the write operation. The main function of VSBK is to set the predetermined voltage level and to constantly supply power. VDBK1a operates only in the switching of the voltage level. VSBK1a is a circuit for controlling the switching speed of the voltage level. Conceptually, VSBK corresponds to the portion of the switch SWm in FIG. 5, and VDBK1a corresponds to the portion of the switch SWs in FIG. 5.

In VSBK, MP10 and MP12 are coupled with the source/drain paths coupled in parallel between the power supply voltage VDDM and a common power supply node CWSRC [0]. Further, MP11, MN11, and MN10 are coupled with the source/drain paths coupled in series between CWSRC [0] and the ground power supply voltage VSS, in which MP11 is provided on the side of CWSRC [0] and MN10 is provided on the side of VSS. The gates of MP10 and MN10 are controlled by the write assist enable signal WTE. Then, a fixed voltage TE is applied to the gate of MP11. The voltage level of CWSRC [0] is fed back to the gate of MN11. The voltage level of the common coupling node of MP11 and MN11 is fed back to the gate of MP 12. In VDBK1a, MN12 is coupled with the source/drain path between CWSRC [0] and VSS, in which the gate is controlled by the write assist pulse signal WPT.

Further, the common node CWSRC [0] is coupled to the memory cell power supply lines ARVDD [0] to ARVDD [3], respectively, through the source/drain paths of four PMOS transistors for this case. Here, it is typically shown a PMOS transistor MP21 corresponding to ARVDD [0], as one of the four PMOS transistors. The source/drain path of the PMOS transistor is also coupled between each of the memory cell power supply lines ARVDD [0] to ARVDD [3], and the power supply voltage VDDM. Here, a PMOS transistor MP20 20 is typically shown as the PMOS transistor corresponding to ARVDD [0].

The gate of MP20 is controlled by a write column selection signal CWSE [0]. The gate of MP 21 is controlled by a read column selection signal CRSE [0]. MP20 and MP21 correspond to a part of the column selection circuit YSW in FIG. 1. Here, in the configuration shown in FIG. 1, one I/O is assigned to four bit line pairs in the write operation. In other words, the write operation is performed with respect to one of the four bit line pairs. Further, in the configuration shown in FIG. 7A, four memory cell power supply lines are assigned to one write assist circuit.

Here, for example, when data is written into the memory cell coupled to ARVDD [0], both the write assist enable signal WTE and the write column selection signal CWSE [0] are changed from the 'L' level to the 'H' level as shown in the write cycle (T1) shown in FIG. 8. Then, the write column selection signal CRSE [0] is changed from the 'H' level to the 'L' level. At this time, the other write column selection signals (here shows CWSE [1] corresponding to ARVDD [1] as an example) hold the 'L' level, while the other read column selection signals (here shows CRSE [1] corresponding to ARVDD [1] as an example) hold the 'H' level. In this way, MP 20 is turned off, and ARVDD [0] is coupled to CWSRC [0] through MP21. Then, VDDM is applied to ARVDD [1] to ARVDD [3] through the PMOS transistor corresponding to MP20 of ARVDD [0].

Further, VDDM is applied to CWSRC [0] in VSBK through MP10 when WTE is at the 'L' level. At this time, MN10 and MP12 are turned off. On the other hand, when WTE is changed to the 'H' level, MP10 is turned off and MN10 is turned on. As a result, MN11 is turned on. At this time, TE is applied to the gate of MP11 to have an appropriate on-resistance. Thus, the electric charge of CWSRC [0] is discharged through MP11, MN11, and MN10. Then, the voltage level of CWSRC [0] is reduced and MP12 is turned on. Here, if the voltage level of CWSRC [0] is too low, the on-state of MP12 increases while the on-state of MN11 decreases. Thus, the voltage level increases. On the other hand, if the voltage level is too high, the on-state of MP12 decreases while the on-state of MN11 increases. Thus, the voltage level decreases. As a result, the voltage level of CWSRC [0] converges to a predetermined voltage level that is defined by the ratio of the on-resistance when MP12, MP11, MN11, and MN10 are balanced in the on-state. Then, the voltage level of CWSRC [0] is changed to the voltage level of ARVDD [0] through MP21.

Further, in the write cycle (T1), an 'H' pulse is applied to the write assist pulse signal WPT when WTE is changed to the 'H' level. Thus, MN12 of VDBL1a is turned on, and the electric charge of CWSRC [0] is quickly discharged to VSS in the 'H' pulse time of WPT. Then, the voltage level of CWSRC [0] decreases rapidly. Thus, it is possible to control the reduction speed of the voltage level of CWSRC [0] (ARVDD [0]) by controlling the 'H' pulse time of WPT. Then, when the write operation is completed, WTE and CWSE [0] are changed to the 'L' level, and CRSE [0] is changed to the 'H' level. In this way, the voltage level of both CWSRC [0] and ARVDD [0] is returned to VDDM.

Next, the write assist circuit WAST1b shown in FIG. 7B is different from the WAST1a shown in FIG. 7A in the circuit configuration of the dynamic unit. In FIG. 7B, the dynamic unit VDBK1b of WAST1b includes a PMOS transistor MP13 with the source-drain path coupled between the common coupling node of MP11 and MN11 in the static unit VSBK, and the common power supply node CWSRC [0]. The gate of MP13 is controlled by the inverted signal (/WPT) of the write assist pulse signal WPT.

The excessive reduction of the voltage level of CWSRC [0] can be easily prevented by using VDBK1b shown in FIG. 7B, differently from the case of using VDBK1a shown in FIG. 7A. In other words, when the voltage level of CWSRC [0] is too low, NM11 of VSBK is turned off to automatically stop the reduction of the voltage level. As a result, it is possible to simplify the timing design of the write assist pulse signal WPT (/WPT). Further, for example, by using the static unit VSBK of feedback circuit type shown in FIGS. 7A and 7B, it is possible to generate a more stable voltage level compared to the case of generating a predetermined voltage level by the simple resistance voltage dividing method. Note that each transistor in VSBK mainly has a function for determining the DC voltage level in the write cycle (T1), so that the transistor size can be small. However, preferably the transistor in VDBK1a and VDBK1b has a relatively large drive capability in order to remove the electric charge at high speed. Thus, the transistor size in VDBK1a and VDBK1b is preferably greater than that of each transistor in VSBK.

<Details of the Write Assist Timing Generation Circuit>

Figure 9:
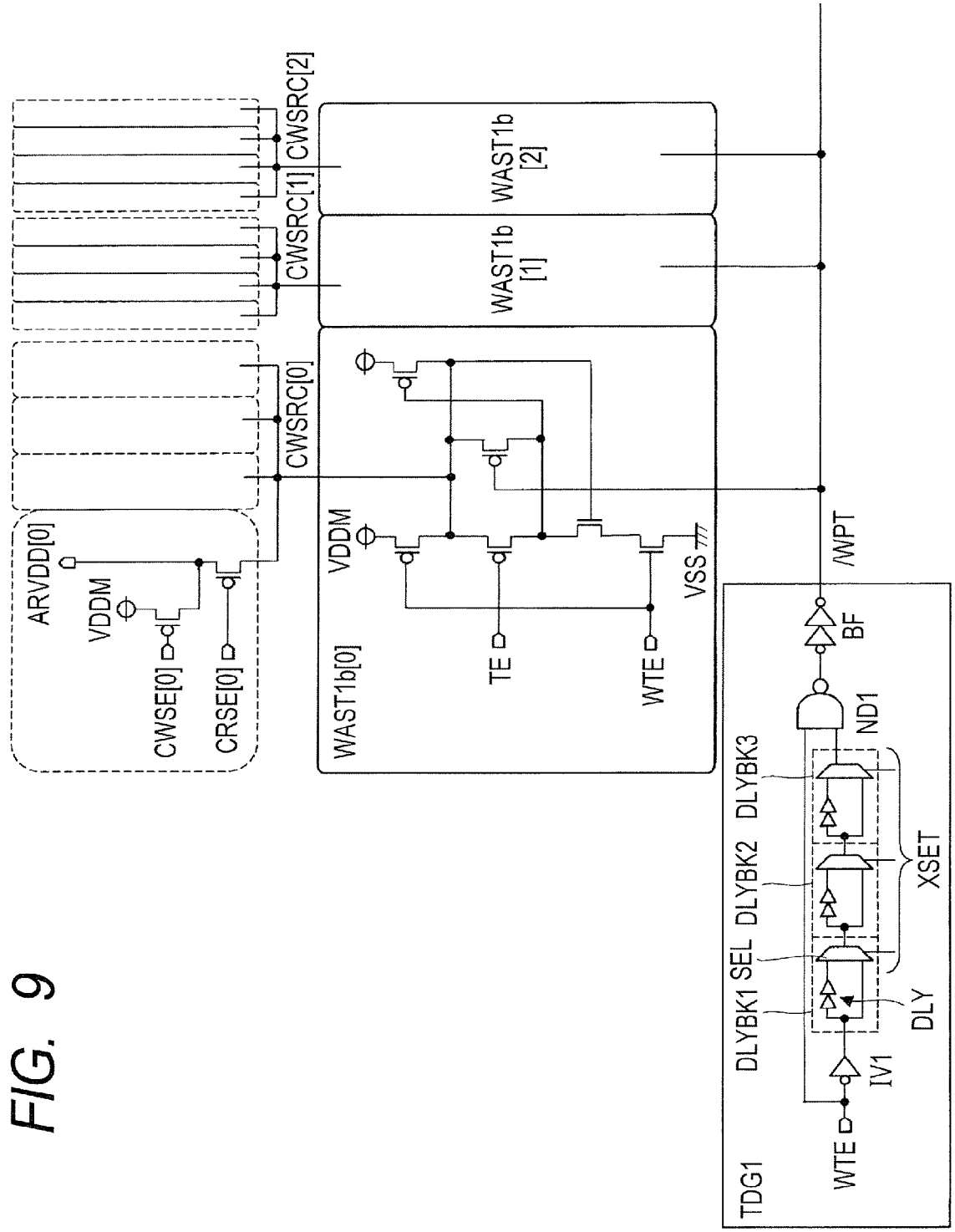
FIG. 9 is a circuit diagram of a detailed configuration example of the write assist timing generation circuit in FIG. 5.

FIG. 9 is a circuit diagram of a detailed configuration example of the write assist timing generation circuit shown in FIG. 5. The write assist timing generation circuit TDG1 shown in FIG. 9 includes an inverter circuit IV1, a plurality of (here, three) delay circuit blocks DLYBK1 to DLYBK3, a NAND circuit ND1, and a buffer circuit BF. The write assist enable signal WTE is input to one of two inputs of the ND1. The inverted signal of the WTE through IV1 is input to the other one of the two inputs of ND1, sequentially through DLYBK1 to DLYBK3. BF buffers the output of ND1, and outputs the inverted signal (/WPT) of the write assist pulse signal WPT. The inverted signal of WPT (/WPT) is input to the write assist circuit WAST1b ([0], [1], [2], and so on) having the circuit configuration shown in FIG. 7B.

Each of DLYBK1 to DLYBK3 includes a selector circuit SEL. The selector circuit SEL includes two paths. Ends of the two paths are commonly coupled to the input node of the delay circuit block. The other ends of the two paths are two inputs, and the output is coupled to the output node of the delay circuit block. A delay element DLY (for example, a multi-stage inverter circuit and the like) with a predetermined amount of delay is inserted into one of the two paths. The output node of DLYTBK1 is coupled to the input node of DLYBK2. The output node of DLYTBK2 is coupled to the input node of DLYBK3. Here, the selection (namely, whether through DLY or not) of SEL included in each of the delay circuit blocks DLYBK1 to DLYBK3, is performed based on the information of the number of rows XSET.

As described above, the 'H' pulse of WTE is input to one of the two inputs of ND1. Then, the signal delayed by the 'L' pulse based on XSET, which is the inverted signal of the 'H' pulse, is input to the other input of ND1. As a result, ND1 outputs the 'L' pulse signal with the delay time determined based on XSET as the pulse width. Note that each of the delay elements DLY included in DLYBK1 to DLYBK3 is preferably weighted. For example, the delay of each DLY in DLYBK1:DLYBK2:DLYBK3 is set to a 1:2:4 ratio, and the like, in order to adjust the pulse width in the range of 0 to 7 according to the value of XSET.

<Outline of the Writing Assist Circuit (Modification)>

Figure 10:
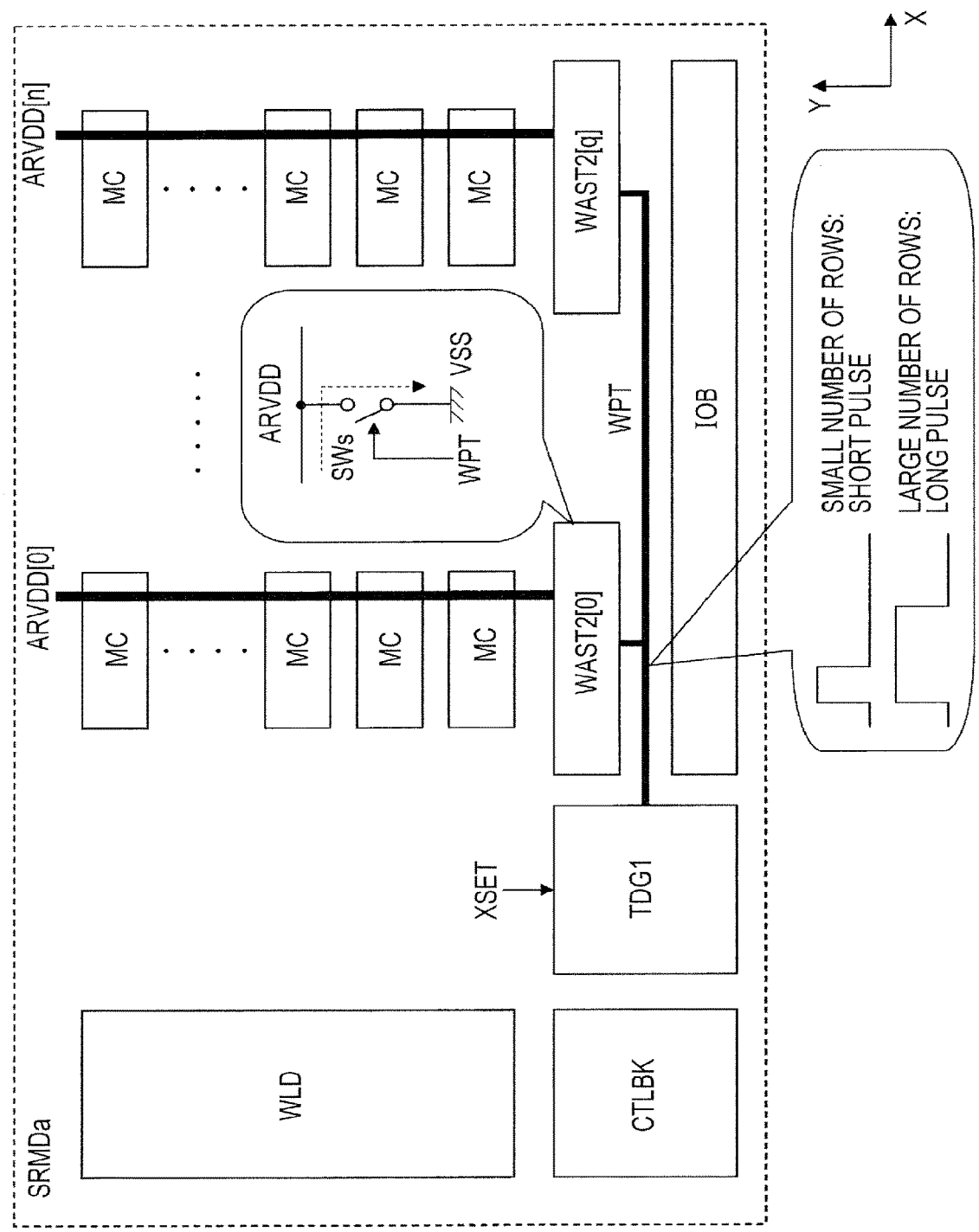
FIG. 10 is a schematic diagram of an example of the function around the write assist circuit, which is partially different from the case of FIG. 5.

FIG. 10 is a schematic diagram of an example of the function around the write assist circuit, which is partially different from the case of FIG. 5. A static memory module SRMDa in FIG. 10 includes write assist circuits WAST2 [0] to WAST2 [q], instead of WAST1 [0] to WAST1 [q] shown in FIG. 5. Each of the write assist circuits WAST2 [0] to WAST2 [q] does not include the portion of the switch SWm for the write assist enable signal WTE in FIG. 5, but includes only the switch SWs for the write assist pulse signal WPT. More specifically, for example in FIG. 7A, each of WAST2 [0] to WAST2 [q] does not include the static unit VSBK but includes only the dynamic unit VDBK1a.

In general, the current consumption is very small in the SRAM memory cell, so that the static unit is not included in the SRAM memory cell. In this case, the voltage level can also be maintained for a certain period of time, by reducing the memory cell power supply voltage to a predetermined voltage level by the dynamic unit (switch SWs), and by turning off SWs to switch the memory cell power supply line to a high impedance state. Thus, it is also possible to form the write assist circuit with the configuration shown in FIG. 10, in which a reduction in the circuit area and the like can be achieved. However, when the memory cell power supply line is switched to the high impedance state, for example, malfunction or other problems may occur due to the mixture of external noise or other factors. From this point of view, it is preferable to use the configuration example shown in FIG. 5.

Figure 11:
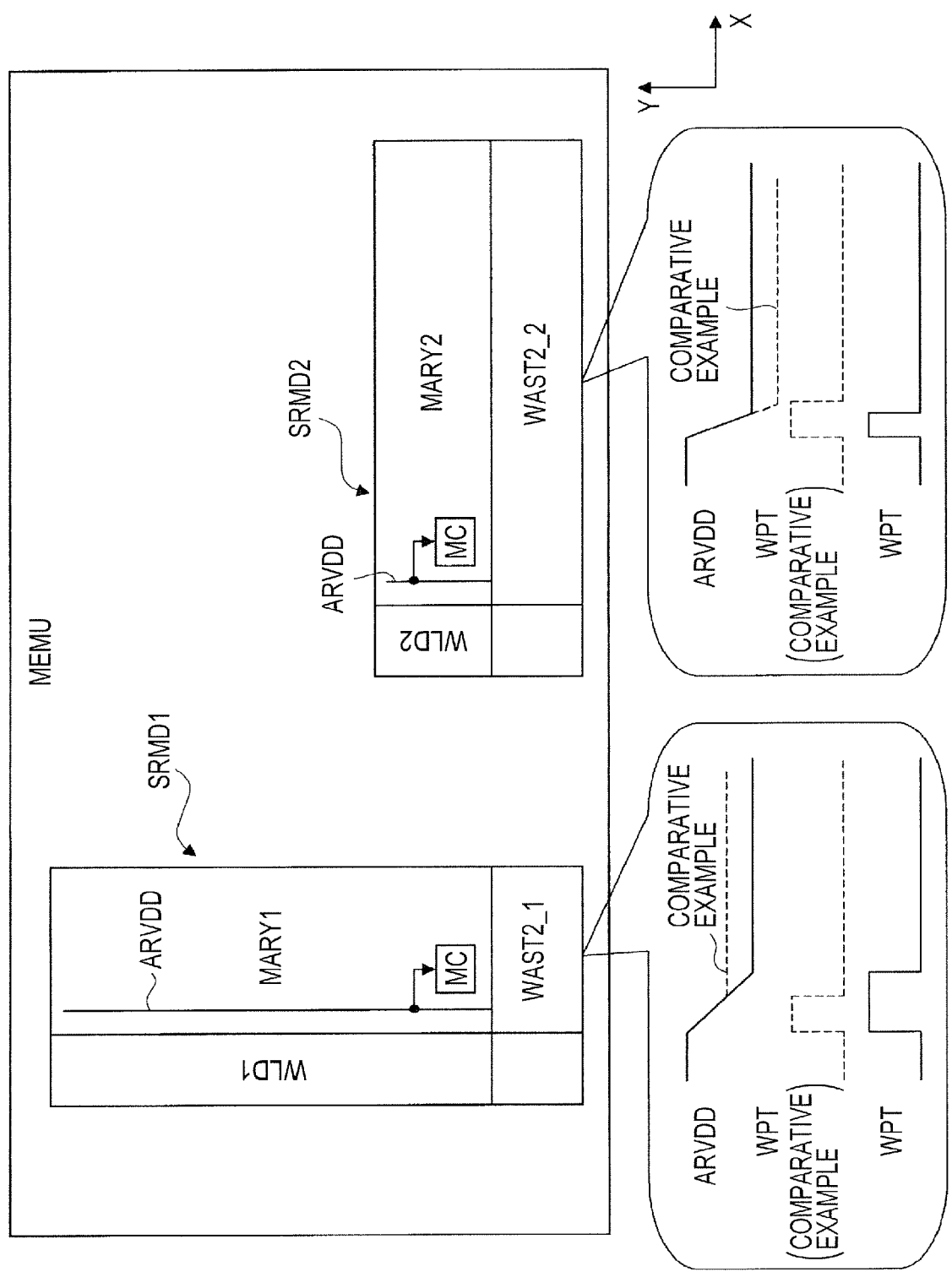
FIG. 11 is a schematic diagram of an example of the effect in the memory unit in FIG. 4, when the write assist circuit in FIG. 10 is applied to each static memory module of the particular memory unit.

FIG. 11 is a schematic diagram of an example of the effect in the memory unit in FIG. 4, when the write assist circuit in FIG. 10 is applied to each static memory module of the particular memory unit. The memory unit MEMU shown in FIG. 11 includes the longitudinal long static memory module SRMD1, and the laterally long static memory module SRMD2, similarly to FIG. 6. The number of rows in SRMD1 is greater than in SRMD2. In other words, the length in the Y-axis direction is longer in SRMD1. Thus, the write assist pulse signal WPT with a wide pulse width is applied to a write assist circuit WAST2_1 of SRMD1. Then, WPT with a narrow pulse width is applied to a write assist circuit WAST2_2 of SRMD2.

For example, in FIG. 10, the drive capability of the switch SWs and the pulse width of WPT are the same in SRMD1 and SRMD2. In this case, the voltage level of the reduced memory cell power supply voltage ARVDD can differ depending on the length (the amount of the load) of the memory cell power supply line as shown in the comparative example shown in FIG. 11. Here it is shown that the voltage level of ARVDD is too high in SRMD1 and the voltage level of ARVDD is too low in SRMD2. If the voltage level of ARVDD is too high, the write margin could be reduced as described above. If the voltage level of ARVDD is too low, for example, the latch operation could not be sufficient for the completion of the write operation, or the latch capability could not be enough in the non-written memory cell coupled to the particular ARVDD. Thus, as shown in FIG. 11, the pulse width of WPT is changed according to the length (the number of word lines (or rows)) of the memory cell power supply line. In this way, the voltage level of ARVDD can be kept constant regardless of the array configuration. As a result, it is possible to avoid the situations described above.

As described above, by using the semiconductor device according to the first embodiment, it is typically possible to increase the operation margin of the static memory modules included in the semiconductor device.

<Other Modifications>

In the above description, the electric charge is removed from the memory cell line by adjusting the pulse width. However, for example, it is possible to adjust the size (for example, the gate width) of the transistors MN12 and MP13 in FIGS. 7A and 7B, instead of adjusting the pulse width. In other words, in the two memory modules, the transistor size of the transistors MN12 and MP13 is greater in the memory module with a large number of word lines than in the memory module with a small number of word lines. Note that a plurality of transistors can be provided. In this case, the sum (or drive capability) of the size (gate width) of the transistors with a large number of word lines, is greater than that of the transistors with a small number of word lines. Thus, it is possible to increase the capability to remove the electric charge of the memory cell power supply line of the memory module with a larger number of word lines.

Second Embodiment

<Outline of Around the Write Assist Timing Generation Circuit (Modification)>

Figure 12:
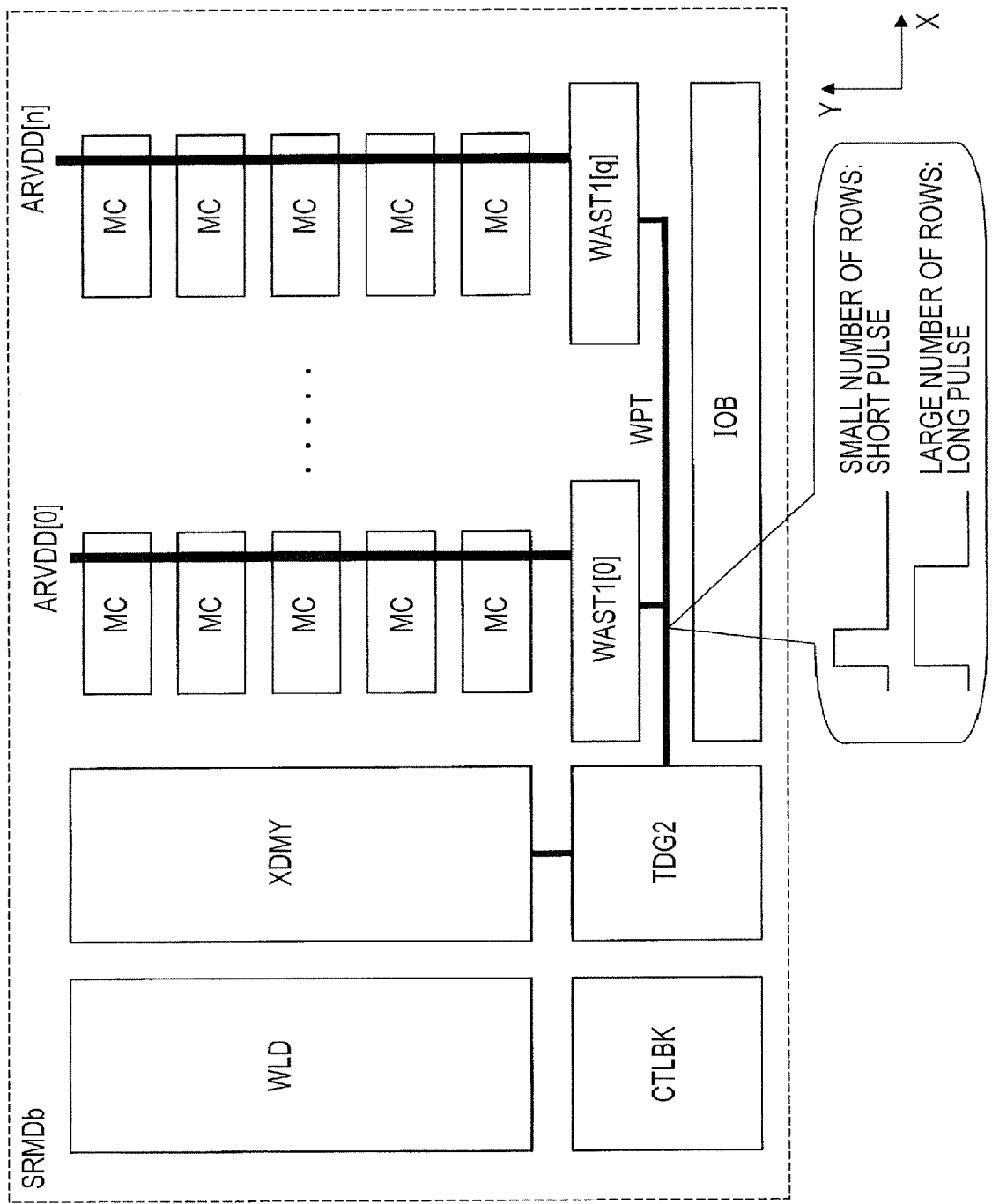
FIG. 12 is a schematic diagram of a configuration example around the write assist timing generation circuit different from that in FIG. 5, in a semiconductor device according to a second embodiment.

FIG. 12 is a schematic diagram of a configuration example around the write assist timing generation circuit different from that in FIG. 5, in a semiconductor device according to a second embodiment. In FIG. 12, similarly to FIG. 5, the static memory module typically includes the word driver block WLD, control circuit block CTLBK, input/output buffer circuit IOB, write assist circuits WAST1 [0] to WAST1 [q], and a plurality of memory cells MC. Further, in FIG. 12, SRMDb includes a write assist timing generation circuit TDG2 that is different from FIG. 5. In addition, a rows dummy load circuit XDMY is newly added to SRMDb.

The rows dummy load circuit XDMY has a size in the Y-axis direction that is proportional to the size (the number of word lines (rows)) in the Y-axis direction of the word driver block WLD. The larger the size in the Y-axis direction the larger the delay generated by XDMY. Typically, the size of XDMY in the Y-axis direction is set to the same value as the size in the Y-axis direction of WLD. The write assist timing generation circuit TDG2 is different from TDG1 of FIG. 5 in that the information of the number of rows XSET is not input to TDG2. However, TDG2 obtains the number of rows by the delay generated by XDMY, and outputs the write assist pulse signal WPT with the pulse width according to the particular delay. Each of WAST1 [0] to WAST1 [q] controls the rate of fall of the memory cell power supply voltages ARVDD [0] to ARVDD [n] by WPT in the write operation, similarly to FIG. 5.

With this configuration example, it is possible to generate the delay according to the number of rows easily or more accurately by using XDMY. As a result, it is possible to achieve easy or precise control of the rate of fall of the memory cell power supply voltage using the write assist circuit. That is, for example, when the pulse width of WPT is adjusted by TDG1 in FIG. 9 as described above, the pulse width is controlled digitally with a predetermined step size. In order to precisely reflect the number of rows in the pulse width of WPT, it is necessary to reduce the delay of each delay element DLY and to provide a large number of delay circuit blocks (DLYBK). In this case, it could lead to problems such as the increase in the circuit area and the complexity of the circuit. On the other hand, as shown in FIG. 12, when the pulse width is controlled by XDMY, it is possible to generate large delay by using the parasitic elements (parasitic capacitance, parasitic resistance) of XDMY as the size (namely, the number of rows) of XDMY is increased. Thus, the analog control of the pulse width can be facilitated. In addition, since the information of the number of rows XSET is not used, it is possible to remove the burden of setting XSET.

<Details of the Write Assist Timing Generation Circuit (Modification)>

Figure 13:
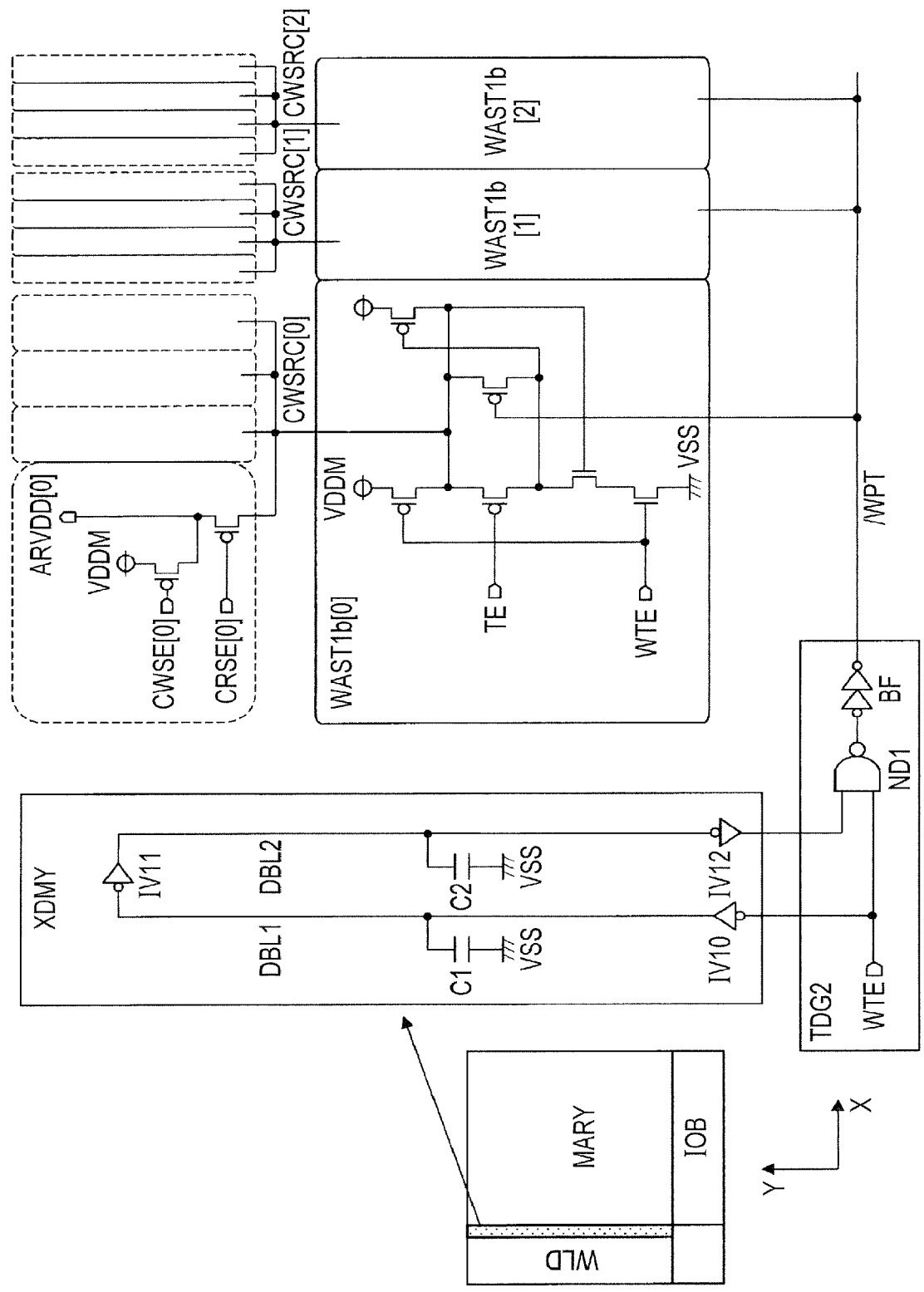
FIG. 13 is a circuit diagram of a detailed configuration example of a rows dummy load circuit and the write assist timing generation circuit shown in FIG. 12.

FIG. 13 is a circuit diagram of a detailed configuration example of the rows dummy load circuit and the write assist timing generation circuit shown in FIG. 12. In FIG. 13, the rows dummy load circuit XDMY includes inverter circuits IV10 to IV12, two dummy bit lines DBL1 and DBL2, and capacitances C1 and C2. Here, the dummy bit lines DBL1 and DBL2 extend in parallel in the Y-axis direction (the extension direction of the bit line (not shown) and the memory cell power supply line ARVDD). IV10 receives a write assist enable signal WTE as an input, and outputs the inverted signal to an end of DBL1. IV11 receives a signal from the other end of DBL1 as an input, and outputs the inverted signal to an end of DBL2. IV12 receives a signal from the other side of DBL2 as an input, and outputs the inverted signal to the write assist timing generation circuit TDG2. Here, DBL1 is the outward line and DBL2 is the return line.

The line length of DBL1 and DBL2 is defined according to the size in the Y-axis direction of the word driver block WLD as described above. The capacitance C1 is coupled between DBL1 and the ground power supply voltage VSS. The capacitance C2 is coupled between DBL2 and VSS. The parasitic capacitance of DBL21 is included in C1, and the parasitic capacitance of DBL2 is included in C2. Thus, the longer the dummy bit lines DBL1 and DLB2, the larger the capacitance values of C1 and C2. Further, C1 and C2 may include a separately formed capacitance element. More specifically, for example, it is possible to use a circuit configuration and layout so that the capacitance element (for example, diffusion layer capacitance, MOS capacitance, and the like) is added to DBL1 and DBL2 at fixed length intervals. In this case also, the longer the DBL1 and DLB2, the larger the capacitance values of C1 and C2.

XDMY delays the 'H' pulse of WTE input from IV10 mainly by the time corresponding to the parasitic resistance values of DBL1 and DBL2 and to the capacitance values of C1 and C2. Then, XDMY outputs the 'L' pulse through IV12. In the write assist timing generation circuit TDG2 shown in FIG. 13, the inverter circuit IV1 and the delay path including the delay circuit blocks DLYBK1 to DLYBK3 are removed from TDG1 shown in FIG. 9. Instead, the particular path is replaced by a delay path through XDMY.

That is, WTE is input to one of the two inputs of the NAND circuit ND1. Then, a signal obtained by delaying and inverting WTE through XDMY, which is the output signal of IV12, is input to the other of the two inputs of ND1. In this way, similarly to the case of TDG1, ND1 outputs the 'L' pulse signal with the delay time based on XDMY as the pulse width. The 'L' pulse signal is converted to the inverted signal (/WPT) of the write assist pulse signal WPT through the buffer circuit BF. The write assist circuit WAST1*b* ([0], [1], [2], and so on) controls the rate of fall of the memory cell power supply voltage ARVDD by using the inverted signal (/WPT). As a result, it is possible to increase the write margin regardless of the array configuration. Note that XDMY in FIG. 13 sets the delay time by using one pair of to-and-from lines (DBL1, DBL2). However, it may also be possible to set the delay time by providing two or more pairs of to-and-from lines.

As described above, by using the semiconductor device according to the second embodiment, it is typically possible to increase the operation margin of the static memory modules included in the semiconductor device. In general, the difference in the number of rows in the memory modules described in the first and second embodiments differs by a power of two. For example, it is assumed that the number of word lines (rows) of one memory module is 256 (multiplied by two to the eighth power). In this case, when the number of word lines of the other memory module is less than 256, the number is for example 128 (multiplied by two to the seventh power). When the number of word lines (rows) is more than 256, the number is for example 512 (multiplied by two to the ninth power).

Third Embodiment

<Outline of the Word Driver Power Supply Circuit Block (Main Characteristics of Third Embodiment)>

Figure 14:
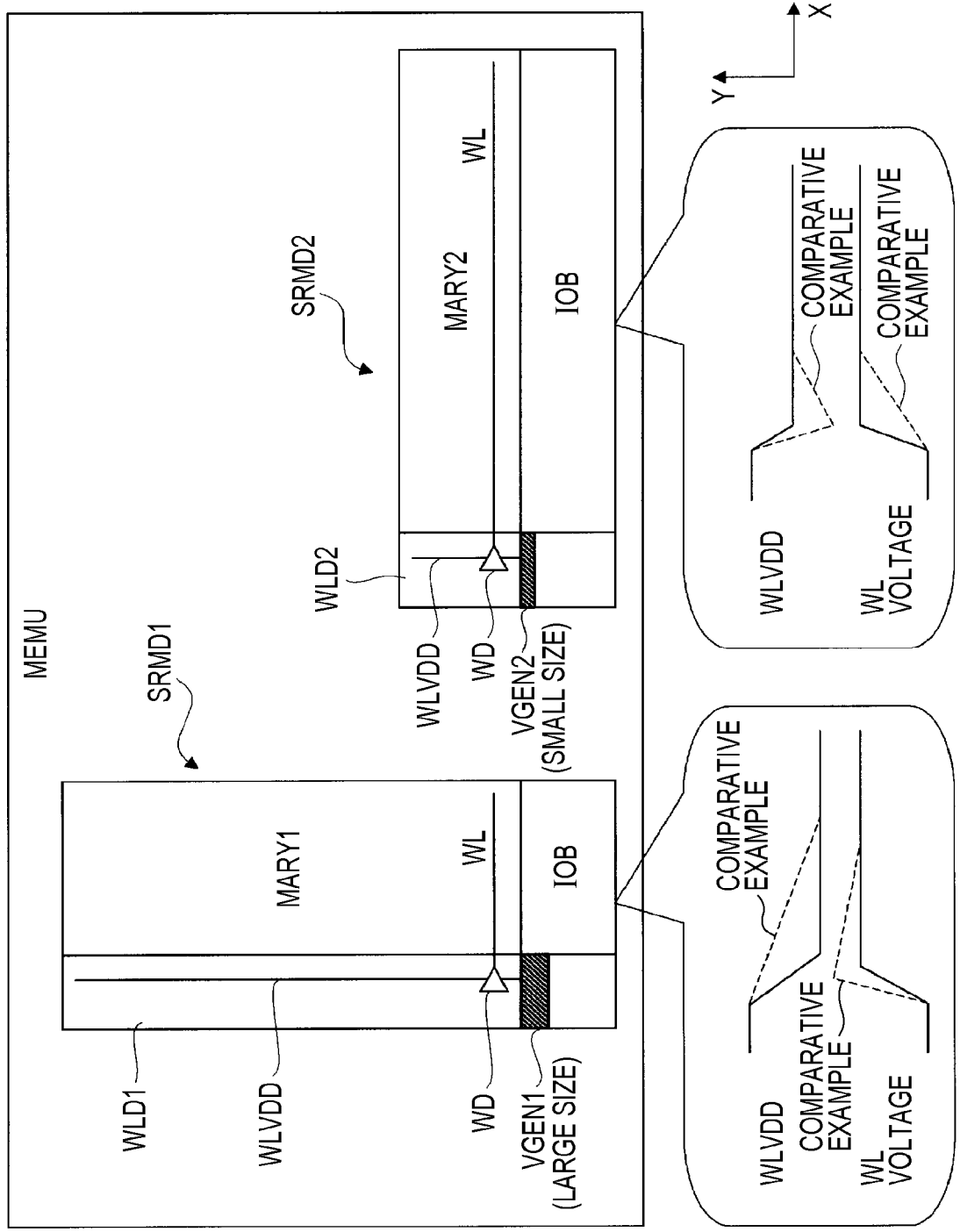
FIG. 14 is a schematic diagram of an example of the characteristics of the word driver power supply circuit block included in each static memory module in the memory unit shown in FIG. 4, in a semiconductor device according to a third embodiment of the present invention.

FIG. 14 is a schematic diagram of an example of the characteristics of the word driver power supply circuit block included in each static memory module in the memory unit shown in FIG. 4, in a semiconductor device according to a third embodiment of the present invention. The memory unit MEMU shown in FIG. 14 includes a longitudinally long static memory module SRMD1 and a laterally long static memory module SRMD2, in which the extension direction of the word line WL is the lateral direction (X-axis direction), and the extension direction of the word driver power supply line WLVDD is the longitudinal direction (Y-axis direction).

SRMD1 includes a word driver block WLD1 including word drivers WD corresponding to the number of word lines WL in a memory array MARY1. Further, SRMD1 also includes a word driver power supply circuit block VGEN1 for supplying a word driver power supply voltage through WLVDD to each WD in WLD1. Similarly, SRMD2 includes a word driver block WLD2 including word drivers WD corresponding to the number of word lines WL in a memory array MARY2. Further, SRMD2 also includes a word driver power supply circuit block VGEN2 for supplying a word driver power supply voltage through WLVDD to each WD in WLD2.

In the configuration example shown in FIG. 14, the size (drive capability) of VGEN1 is greater than that of VGEN2. More specifically, the gate width of the transistors (namely, the gate width of the transistors MP30 to MP32, and MP 30 in FIG. 16) in the word driver power supply circuit block is large. As described with reference to FIG. 3 and the like, VGEN1 and VGEN2 have the function to reduce the voltage level of the word driver power supply line (word driver power supply voltage) WLVDD in the read operation (write operation). In this way, it is possible to increase the static noise margin (SNM), thus increasing the read margin. However, if the size (drive capability) of the word driver power supply circuit block is the same in SRMD1 and SRMD2, the following problems may occur.

First of all, in SRMD1, the word driver power supply line WLVDD is long, namely, the load is large. Thus, as shown in the comparative example shown in FIG. 14, it could take some time to reduce the word driver power supply voltage WLVDD to a predetermined voltage level. In addition, the word line WL is short in SRMD1, namely, the load is small. Thus, as shown in the comparative example shown in FIG. 14, the rate of rise of WL is high, which could result in an overshoot in the voltage level of WL. As a result, as described with reference to FIG. 25B, the voltage level of WL would be likely to be too high to provide a sufficient read margin in SRMD1.

On the other hand, in SRMD2, the length of WLVDD is short, namely, the load is small. Thus, as shown in the comparative example shown in FIG. 14, WLVDD is quickly reduced to the predetermined voltage level, potentially resulting in an undershoot. In addition, the length of WL is long, namely, the load is large in SRMD2. Thus, as shown in the comparative example shown in FIG. 14, the rate of rise of WL is delayed. As a result, as described with reference to FIG. 25A, the rate of rise of WL would be likely to be too slow to increase the access time in SRMD2.

Thus, according to the third embodiment, one of the main characteristics of the semiconductor device is that the larger the number of rows (word lines) and the smaller the number of columns (bit line pairs), the larger the size (drive capability) of the word driver power supply circuit block VGEN. In other words, when the number of rows is large, the rate of rise of WLVDD is increased by increasing the drive capability of VGEN in order to ensure the read margin. On the other hand, when the number of rows is small, the excess voltage reduction of WLVDD is prevented by reducing the drive capability of VGEN to provide enough rate of rise (access time) of the word line. Further, when the number of columns is small, the rate of fall of WLVDD is increased by increasing the drive capability VGEN to prevent the word line voltage level from being excessively high, in order to ensure the read margin. On the other hand, when the number of columns is large, the drive capability of VGEN is reduced to provide a sufficiently high voltage to WLVDD, in order to prevent the rate of rise (access time) of the word line from being delayed.

In the configuration example in FIG. 14, SRMD1 has a large number of rows and a small number of columns, in which the drive capability (size) of VGEN1 is large. On the other hand, SRMD2 has a small number of rows and a large number of columns, in which the drive capability (size) is small. As a result, as shown in FIG. 14, the word driver power supply voltage WLVDD is reduced to an appropriate voltage level at an appropriate rate of fall. Further, the rate of rise of the word line WL is also controlled to an appropriate rate. Thus, it is possible to provide a sufficient read margin and enough access time regardless of the memory array configuration.

Figure 15A:
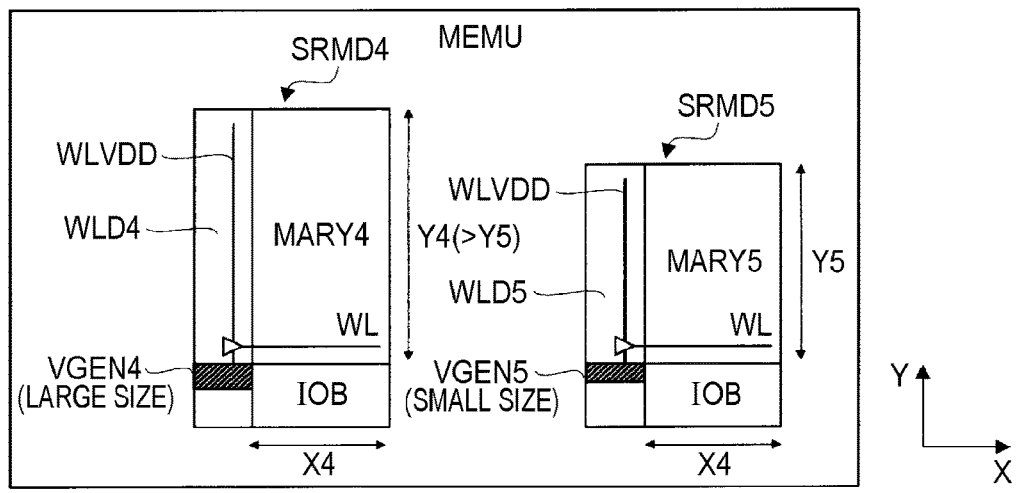
FIGS. 15A to 15C are schematic diagrams of the relationship between the sizes of the word driver power supply circuit blocks when the array configuration of each static memory module in the memory unit is different from the case of FIG. 14.
Figure 15B:
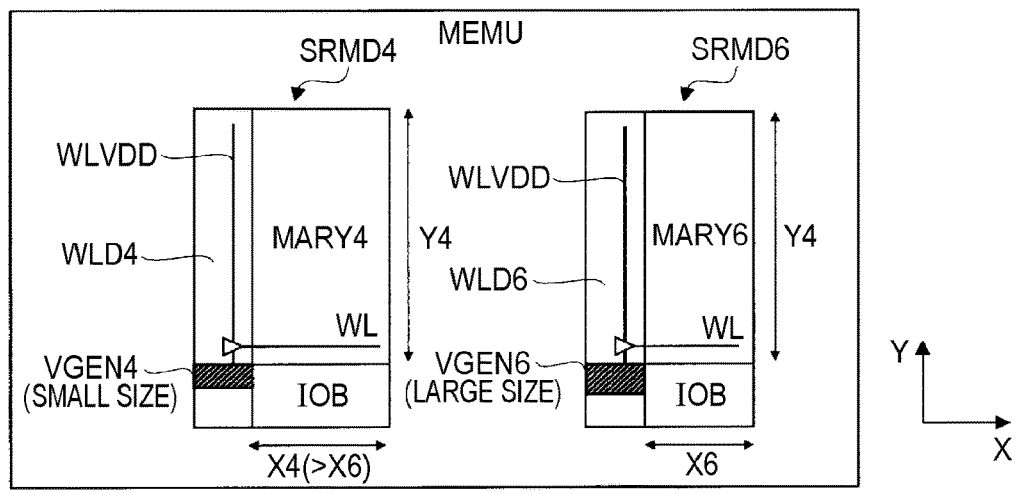
Figure 15C:
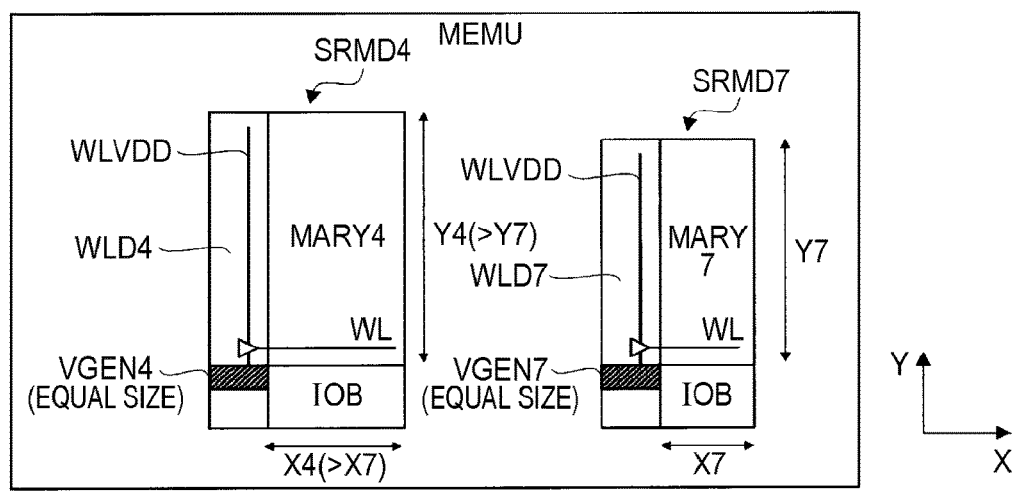

FIGS. 15A to 15C are schematic diagrams of the relationship between the sizes of the word driver power supply circuit blocks when the array configuration of each static memory module in the memory unit is different from the case of FIG. 14. First, in FIG. 15A, the memory unit MEMU includes two static memory modules SRMD4, SRMD5 with the same number of columns. However, the number of rows is different in SRMD4 and SRMD5. SRMD4 has a memory array MARY4 in which X4 also represents the size (the number of columns) in the X-axis direction, and Y4 represents the size (the number of rows) in the Y-axis direction. SRMD5 has a memory array MARY5 in which X4 represents the size (the number columns) in the X-axis direction, and Y5 represents the size (the number of rows) in the Y-axis direction. Here, Y4>Y5, so that the size (drive capability) of the word driver power supply circuit block VGEN4 is set to be larger than the size (drive capability) of the word driver power supply circuit block VGEN5 of SRMD5.

Next, in FIG. 15B, MEMU includes two static memory modules SRMD4, SRMD6 with the same number of rows. However, the number of columns is different in SRMD4 and SRMD6. SRMD4 includes MARY4 with X4 and Y4 as described above. SRMD6 includes a memory array MARY6, in which X6 represents the size (the number of columns) in the X-axis direction, and Y4 is represents the size (the number of rows) in the Y-axis direction. Here, X4>X6, so that the size (drive capability) of the word driver power supply circuit block VGEN6 of SRMD6 is set to be larger than the size (drive capability) of VGEN4 of SRMD4.

Next, in FIG. 15C, MEMU includes two static memory modules SRMD4, SRMD7 with a different number of rows and a different number of columns, respectively. SRMD4 includes MARY4 with X4 and Y4 as described above. SRMD7 includes a memory array MARY7, in which X7 represents the size (the number of columns) in the X-axis direction, and Y7 represents the size (the number of rows) in the Y-axis direction. Here, Y4>Y7 but X4>X7. Thus, the size (drive capability) of the word driver power supply circuit block VGEN7 of SRMD7, and the size (drive capability) of VGEN4 of SRMD4 can be the same.

In the above description, the size is the same between the two static memory modules. More specifically, the number of rows is the same or the number of columns is the same between the two static memory modules. However, a small difference is allowed, and it is possible that the size is substantially the same in the two static memory modules. In general, the number of rows and the number of columns are a power of two. For example, if the number of rows of the first static memory module is 512 (multiplied to two to the ninth power), there may be a difference of, for example, about 10 from 512 in the second static memory module. At this time, the difference may include a redundant line. On the other hand, if the numbers are 256 (multiplied by two to the eighth power) and 1024 (multiplied by two to the tenth power), namely, if the numbers are different by a power of two in the first and second static memory modules, they are not considered to be in the same range.

<Details Around the Word Driver Power Supply Circuit Block>

Figure 16:
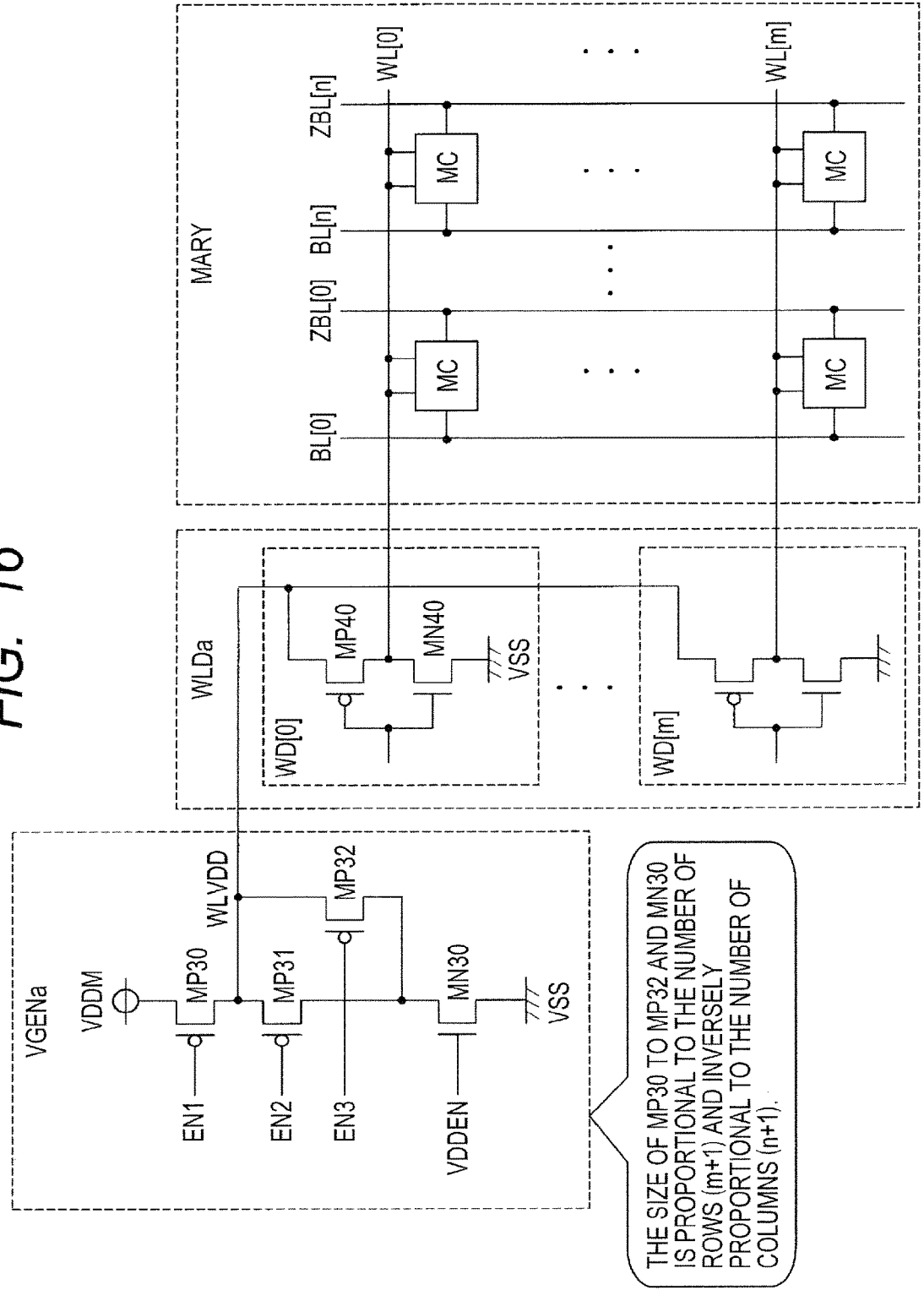
FIG. 16 is a circuit diagram of a detailed configuration example of the word driver power supply circuit block, the word driver block, and the memory array in each static memory module in FIG. 14.
Figure 17:
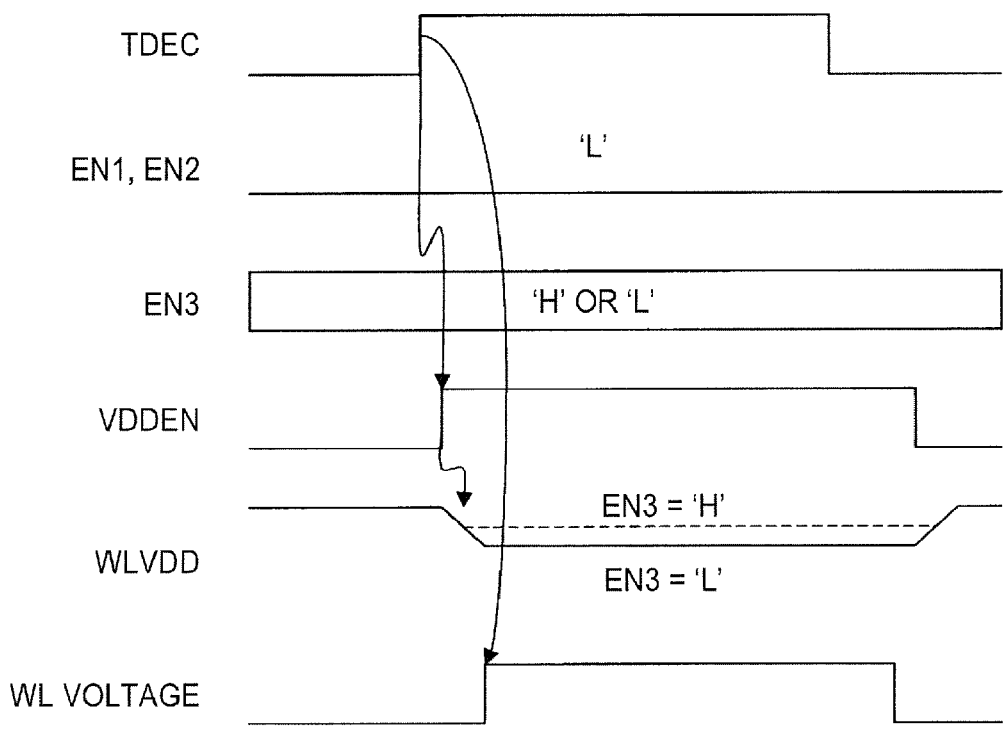
FIG. 17 is a waveform diagram of an operation example of the word driver power supply circuit block in FIG. 16.

FIG. 16 is a circuit diagram of a detailed configuration example of the word driver power supply block, the word driver block, and the memory array in each static memory module shown in FIG. 14. FIG. 17 is a waveform diagram of an operation example of the word driver power supply circuit block in FIG. 16. In FIG. 16, a word driver power supply circuit block VGENa includes PMOS transistors M230 to MP32 and an NMOS transistor MN 30. MP30 is coupled with the source/drain path between the power supply voltage VDDM and the word driver power supply line (the word driver power supply voltage) WLVDD. MP31 and MP32 are coupled in parallel with the source/drain paths between WLVDD and the drain of MN30. The source of MN30 is coupled to the ground power supply voltage VSS. The gates of MP30 to MP32 are controlled by enable signals EN1 to EN3, respectively. The gate of MN30 is controlled by an enable signal VDDEN.

A word driver block WLDa includes (m+1) word drivers WD [0] to WD [m]. Each of WD [0] to WD [m] is a CMOS inverter circuit including a PMOS transistor MP40 and an NMOS transistor MN40. The power voltage of the CMOS inverter circuit is commonly supplied through the word driver power supply line WLVDD from VGENa. The memory array MARY includes (m+1) word lines WL [0] to WL [m], (n+1) bit line pairs (BL [0], ZBL [0]) to (BL [n], ZBL [n]), and a plurality of (here, (m+1)×(n+1)) memory cells MC located at the intersections of the word lines and the bit line pairs. WL [0] to WL [m] are driven by WD [0] to WD [m] of WLDa, respectively.

VGENa performs the operations shown in FIG. 17 in the read operation (write operation). First, when the decode start signal TDEC shown in FIGS. 1 and 3 is at the 'L' level, EN1 and EN2 are at the 'L' level and VDDEN is at the 'L' level. Thus, in VGENa, M230 and MP31 are turned on and MN30 is turned off. Thus, the word driver power supply voltage WLVDD is changed to VDDM. Then, when TDEC is changed to the 'H' level in the read operation (write operation), VDDEN is also changed to the 'H' level. As a result, the voltage level of WLVDD is reduced from VDDM to a voltage level defined by the on-resistance ratio of MP30, MP31, and MN30.

At this time, EN3 is set to the 'H' level or the 'L' level in advance. If EN3 is set to the 'L' level, MP32 is turned on. The on-resistance in the parallel circuit of MP31 and MP32 is reduced. Thus, the reduction in the voltage level of WLVDD is increased compared to the case in which EN3 is set to the 'H' level. For example, the setting of EN3 is performed according to the amount of the power supply voltage VDDM (corresponding to the power supply voltage of VGENa and to the power supply voltage of the memory cell MC) used in the read operation.

For example, when the static memory module includes a normal operation mode and a high-speed operation mode, the voltage level of the VDDM is set to be higher in the high-speed operation mode than in the normal operation mode. In this case, the static noise margin (SNM) (read margin) may be reduced compared to the case of the normal operation mode, due to threshold voltage fluctuations in each transistor of MC. Thus, the magnitude of the reduction in the voltage level of WLVDD is increased in the high-speed operation mode, compared to the normal operation mode. In this way, it is possible to compensate the reduction of the read margin. It goes without saying that the function associated with EN3, MP32 can be omitted.

In parallel to the operation of VGENa, as shown in FIG. 17, the word driver WD [s] (s is an integer of 0 to m) to be selected in WLDa activates the corresponding word line WL [s] as a result of the transition of TDEC to the 'H' level. At this time, the voltage level of WL [s] is defined by the voltage level of WLVDD described above. Then, when TDEC is changed to the 'L' level, WL [s] is activated through WD [s]. Further, VDDEN is returned to the 'L' level. Then, the voltage level of WLVDD is also returned to VDDM.

Here, in the configuration example shown in FIG. 16, the larger the number of rows (word lines) (m+1) or the smaller the number of columns (bit line pairs) (n+1), the larger the transistor size of each of the MOS transistors (MP30 to MP32, MN30) in VGENa. In this way, it is possible to provide a sufficient read margin and enough access time, regardless of the memory array configuration, as described with reference to FIG. 14.

As described above, by using the semiconductor device according to the third embodiment, it is typically possible to increase the operation margin of the static memory modules included in the semiconductor device. In addition, it is possible to speed up the static memory modules.

Fourth Embodiment

<Details Around the Word Driver Power Supply Circuit Block (Modification [1])>

Figure 18:
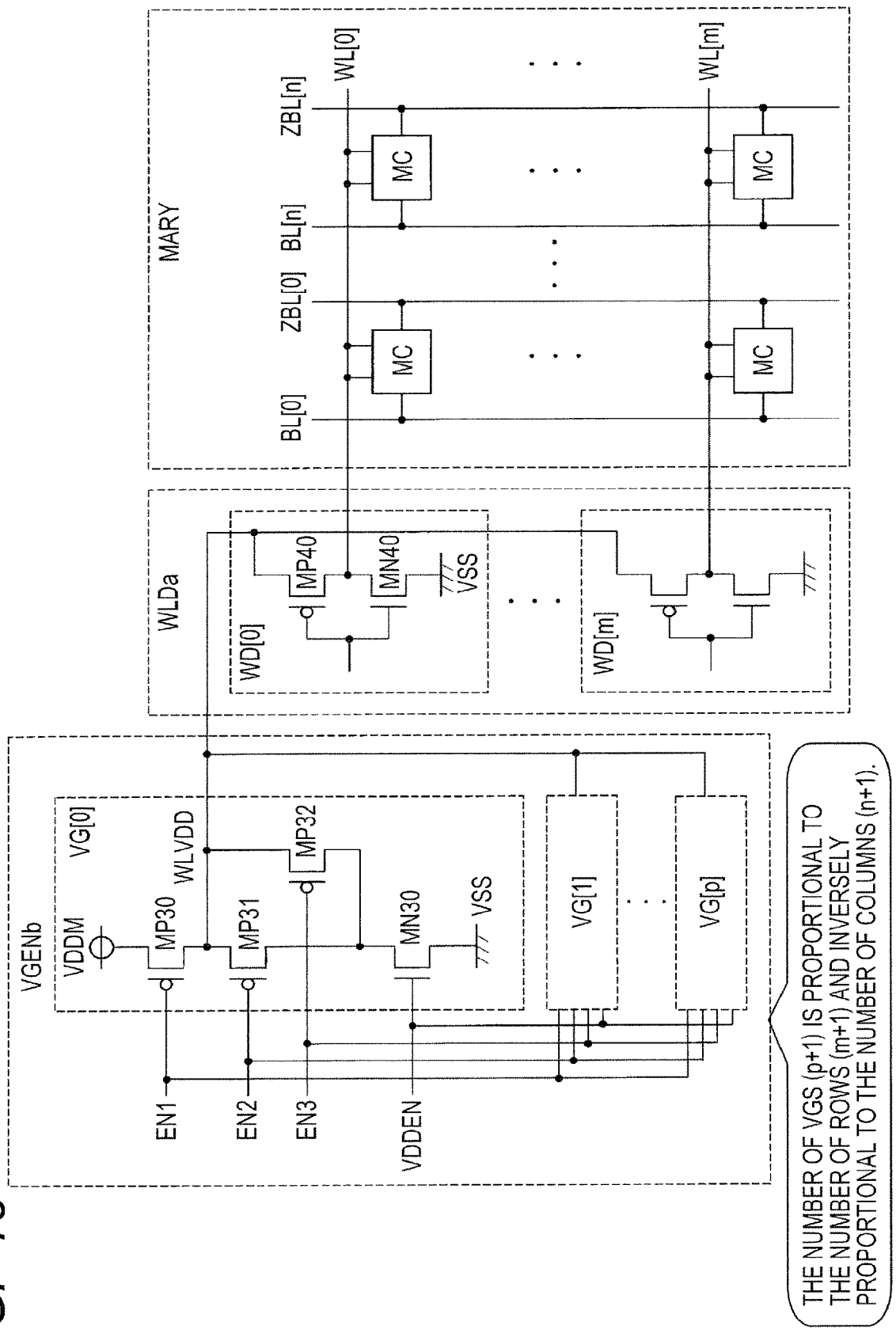
FIG. 18 is a circuit diagram of a detailed configuration example of the word driver power supply circuit block, the word driver block, and the memory array in each static memory module in FIG. 14, in a semiconductor device according to a fourth embodiment of the present invention.

FIG. 18 is a circuit diagram of a detailed configuration example of the word driver power supply circuit block, the word driver block, and the memory array in each static memory module shown in FIG. 14, in a semiconductor device according to a fourth embodiment of the present invention. The configuration example in FIG. 18 is different from the configuration example in FIG. 16 in the internal configuration of the word driver power supply circuit block. Other configurations are the same as those shown in FIG. 16, and thus their detailed description will be omitted. In FIG. 18, a word driver power supply circuit block VGENb includes (p+1) word driver power supply circuits VG [0] to VG [p].

Each of VG [0] to VG [p] includes PMOS transistors MP30 to MP32 and an NMOS transistor MN30, similarly to the case of VGENa shown in FIG. 16. The gates of MP30 to MP32 included in each of VG [0] to VG [p] are commonly controlled by the enable signals EN1 to EN3, respectively. Also, the gates of MN 30 included in VG [0] to VG [p] are commonly controlled by the enable signal VDDEN, respectively. Then, the drains of MP30 (the sources of MP31, MP32) included in VG [0] to VG [p] are commonly coupled to output the word driver power supply voltage WLVDD from the particular common coupling node.

Here, in the configuration example shown in FIG. 18, it is found that the larger the number of rows (word lines) and the smaller the number of columns (bit line pairs), the larger the number of word driver power supply circuits (the value of "p" in VG [0] to VG [p]). That is, in the configuration example shown in FIG. 16, the drive capability of WLVDD is adjusted by the size of each MOS transistor itself, assuming that the MOS transistors included in VG [0] to VG [p] have the same size. However, in the configuration example shown in FIG. 18, the drive capability is adjusted by the number of word driver power supply circuits. From the point of view of circuit design, in the configuration example shown in FIG. 16, the MOS transistors are coupled in parallel to adjust the drive capability by the number of transistors coupled in parallel. In this way, it is possible to provide a sufficient read margin and enough access time, regardless of the memory array configuration, as described with reference to FIG. 14.

The method shown in FIG. 18 is more suitable for the compiled SRAM than the method shown in FIG. 16. For example, when the method of FIG. 16 is used, it may be necessary to prepare a plurality of layout cells with different transistor sizes. However, the method of FIG. 18 requires only one layout cell. Further in the configuration example shown in FIG. 18, for example, MP31 and MP32 can have the same threshold voltage characteristics as the load transistors (MP1, MP2 in FIG. 2) included in the memory cell MC. In this case, fluctuations in the threshold voltage of MP1 and MP2 in MC are also reflected in MP31 and MP32 in each word driver power supply circuit. Thus, it is possible to correct the voltage level of WLVDD according to the fluctuations in the threshold voltage of MP1 and MP2.

As described above, by using the semiconductor device according to the fourth embodiment, similarly to the third embodiment, it is typically possible to increase the operation margin of the static memory modules included in the semiconductor device. In addition, it is possible to speed up the static memory modules.

Fifth Embodiment

<Details Around the Word Driver Power Supply Circuit Block (Modification [2])>

Figure 19:
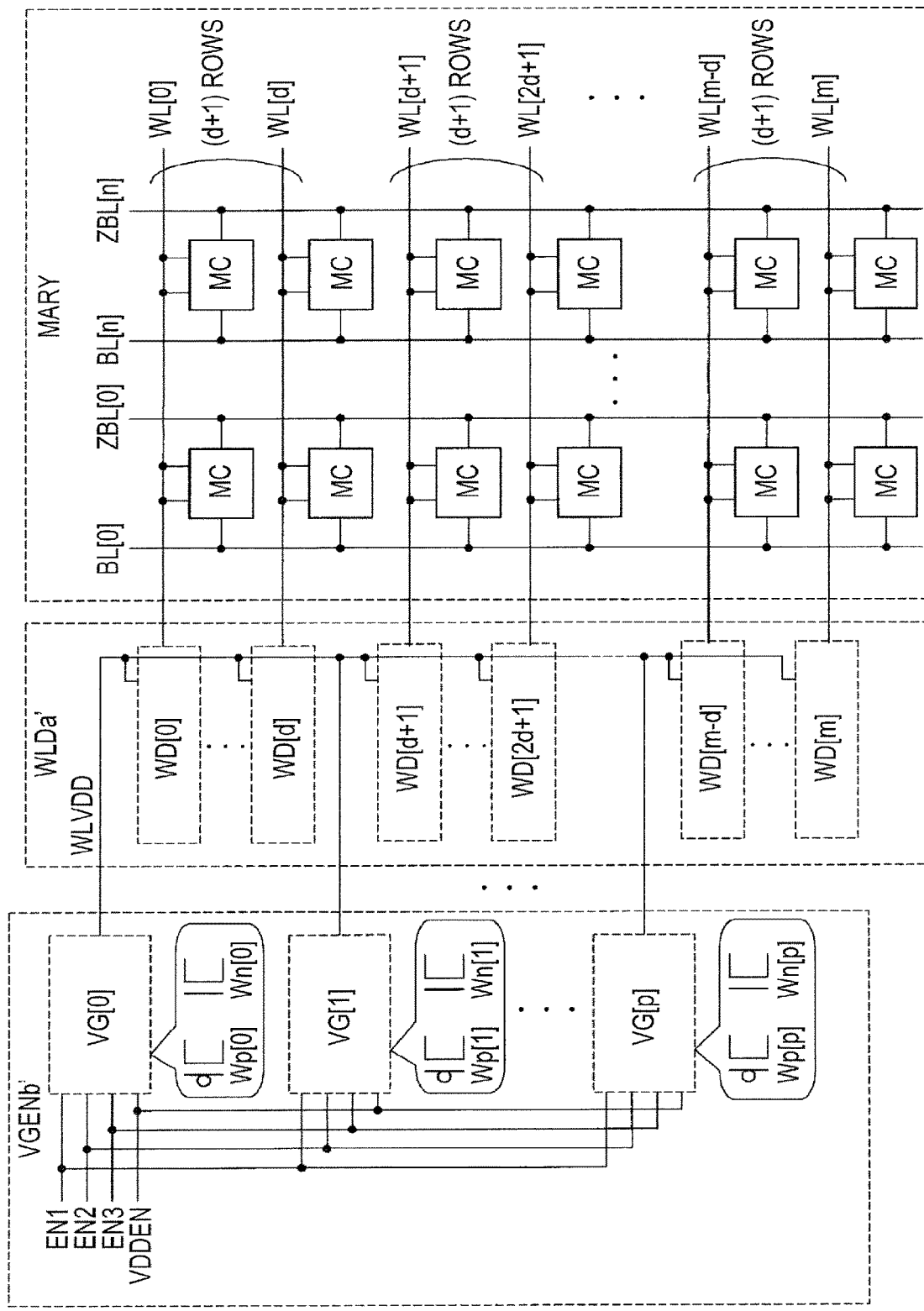
FIG. 19 is a circuit diagram of a detailed configuration example of the word driver power supply circuit block, the word driver block, and the memory array in each static memory module in FIG. 14, in a semiconductor device according to a fifth embodiment of the present invention.

FIG. 19 is a circuit diagram of a detailed configuration example of the word driver power supply circuit block, the word driver block, and the memory array in each static memory module shown in FIG. 14, in a semiconductor device according to a fifth embodiment of the present invention. The configuration example in FIG. 19 is different from the configuration example in FIG. 18 mainly in the output destination of each word driver power supply circuit in the word driver power supply circuit block. Here, the description will focus on this difference. A word driver power supply circuit block VGENb' in FIG. 19 includes (p+1) word driver power supply circuits VG [0] to VG [p] that are commonly controlled by the enable signals EN1 to EN3 and VDDEN, similarly to the case of VGENb shown in FIG. 18.

Further, a word driver block WLDa' in FIG. 19 includes (m+1) word drivers WD ([0], . . . , [d], [d+1], . . . , [2d+1], . . . , . . . , [m−d], . . . [m]) that are arranged in this order in the extension direction of the bit line pairs. Power is supplied to (m+1) WD through one word driver power supply line WLVDD extending in the extension direction of the bit line pair. Here, a coupling node exists for every (d+1) WDs over WLVDD. The word driver power supply circuits VG [0] to VG [p] perform output to different coupling nodes, respectively. In other words, VG [0] performs output to the coupling node adjacent to WD [0], VG [1] performs output to the coupling node adjacent to WD [d+1], and so on. Then, VG [p] performs output to the coupling node adjacent to WD [m−d].

As described above, the word driver supply circuits VG [0] to VG [p] supply power to the nodes separated at a fixed distance in the word driver power supply line WLVDD. Thus, it is possible to reduce a so-called difference between far and near on WLVDD, for example, compared to the case of supplying power from only one terminal of WLVDD. That is, for example, when the voltage level of WLVDD is reduced by using the word driver power supply circuit in the read operation, the arrival time of the voltage level may differ between the word driver located near the word driver power supply circuit and the word driver located far from the word driver power supply circuit. In this case, a difference may occur in the read margin and the like in each memory cell MC in the memory array MARY. This difference can be reduced by supplying power to the separated nodes as described above.

Note that transistor sizes Wp [0] (Wn [0]) to Wp [p] (Wn [p]) in VG [0] to VG [p] can be the same or can be slightly different. In other words, even if the output destinations of VG [0] to VG [p] are distributed, a difference similar to the difference between far and near described above may occur on WLVDD, due to the load balance between the transistor size of each word driver power supply circuit and the transistor size of each word driver, or other factors. Such a difference can be further reduced by an appropriate adjustment of each transistor size in VG [0] to VG [p].

As described above, by using the semiconductor device according to the fifth embodiment, it is typically possible to increase the operation margin of the static memory modules included in the semiconductor device. In addition, it is possible to speed up the static memory modules.

Sixth Embodiment

<Details Around the Word Driver Power Supply Circuit Block (Modification [3])>

Figure 20:
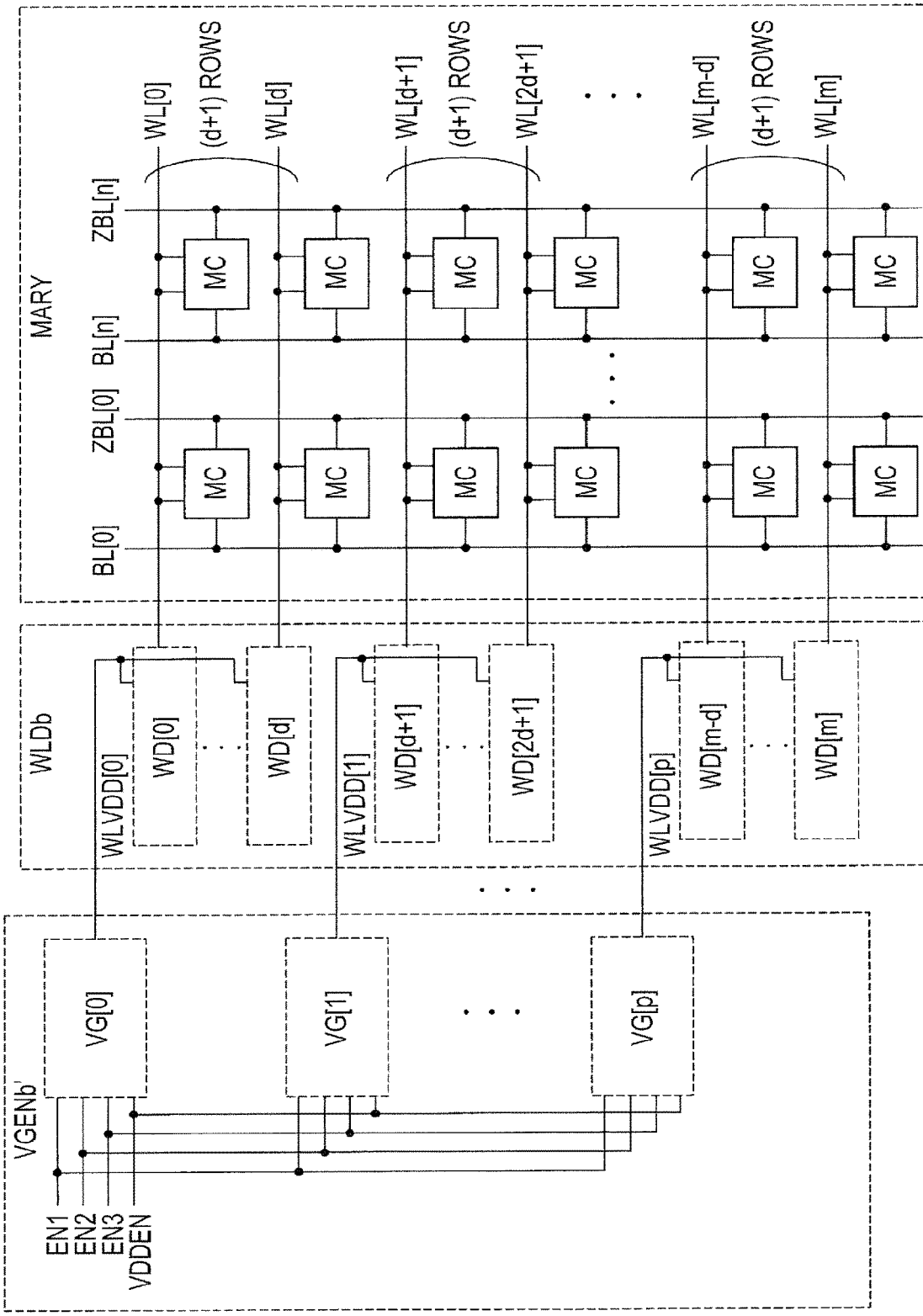
FIG. 20 is a circuit diagram of a detailed configuration example of the word driver power supply circuit block, the word driver block, and the memory array in each static memory module in FIG. 14, in a semiconductor device according to a sixth embodiment of the present invention.

FIG. 20 is a circuit diagram of a detailed configuration example of the word driver power supply circuit block, the word driver block, and the memory array in each static memory module shown in FIG. 14, in a semiconductor device according to a sixth embodiment of the present invention. The configuration example in FIG. 20 is different from the configuration example in FIG. 19 in that the word driver power supply line WLVDD is divided into (p+1) word driver power supply lines WLVDD [0] to WLVDD [p]. Other configurations are the same as those shown in FIG. 19, and thus their detailed description will be omitted.

WLVDD [0] is coupled to an output of the word driver power supply circuit VG [0] in the word driver power supply circuit block VGENb'. Similarly, WLVDD [1] is coupled to an output of VG [1] in VGENb', and so on. Then, WLVDD [p] is coupled to an output of VG [p] in VGENb'. The word driver block WLDb includes (m+1) word drivers WD ([0], . . . , [d], [d+1], . . . [2d+1], . . . , . . . , [m−d], [m]), similarly to FIG. 19. However, different from the case of FIG. 19, power is supplied to each of (d+1) word drivers through different word driver power supply lines, respectively. In other words, power is supplied to WD [0] to WD [d] through WLVDD [0]. Similarly, power is supplied to WD [d+1] to WD [2d+1] through WLVDD [1], and so on. Then, power is supplied to WD [m−d] to WD [m] through WLVDD [p]. With this configuration example, the same effect as in the case of FIG. 19 can also be obtained. However, the characteristics could vary for each of VG [0] to VG [p]. From this point of view, it is preferable to use the configuration example shown in FIG. 19 in order to average the characteristic variation.

As described above, similarly to the third embodiment, by using the semiconductor device according to the sixth embodiment, it is typically possible to increase the operation margin of the static memory modules. In addition, it is possible to speed up the static memory modules.

Seventh Embodiment

<Layout Example of the Word Driver Power Supply Circuit>

Figure 21A:
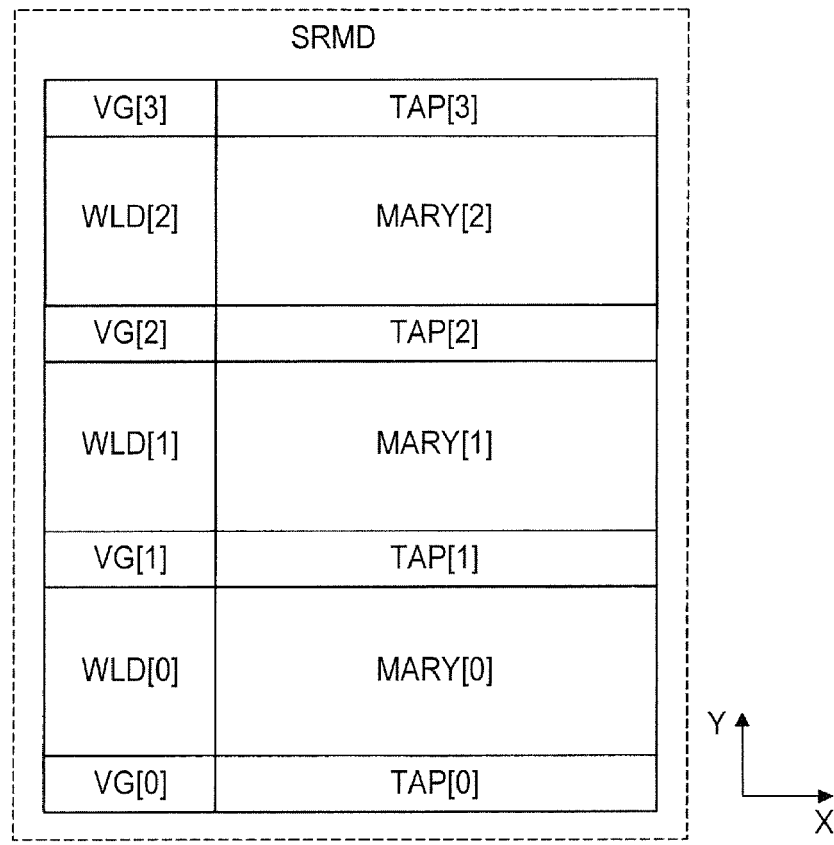
FIGS. 21A and 21B are top views each showing a schematic layout example of each word driver power supply circuit in the static memory module in a semiconductor device according to a seventh embodiment of the present invention.
Figure 21B:
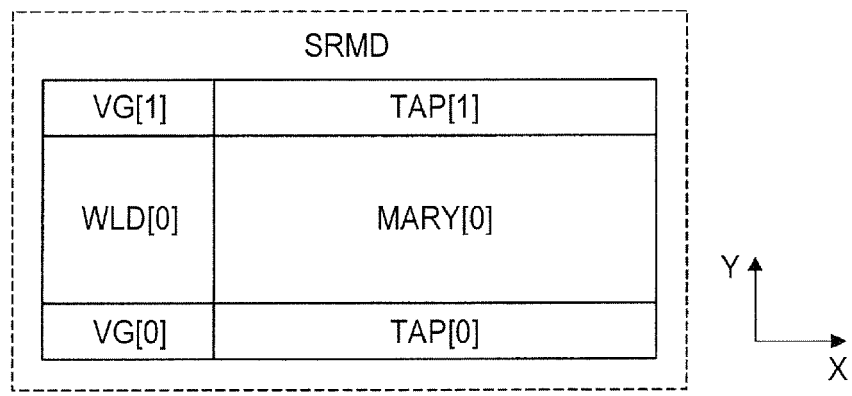

FIGS. 21A and 21B are top views each showing a schematic layout example of each word driver circuit in the static memory module in a semiconductor device according to a seventh embodiment of the present invention. FIGS. 21A and 21B show the layout example of the memory array MARY, the word driver block WLD, and the word driver power supply circuit VG in the static memory module SRMD. In FIG. 21A, the number of rows is large, so that the memory array MARY is divided into a plurality of memory arrays (here, three memory arrays MARY [0] to MARY [2]) in the Y-axis direction (the extension direction of the bit line (not shown)).

Here, there are provided tap regions TAP [0] to TAP [3] on both sides of each memory array in the Y-axis direction. Here, MARY [0] is provided between TAP [0] and TAP [1], MARY [1] is provided between TAP [1] and TAP [2], and MARY [2] is provided between TAP [2] and TAP [3]. Note that the tap region is the region for supplying power to p-type and n-type wells included in each memory array. For example, one memory array with a large number of rows is provided in which tap regions are formed on both sides of the memory array in the Y-axis direction to supply power. In this case, the power supply may not be sufficient in the vicinity of the center of the memory array in the Y-axis direction. Thus, it is useful to divide and provide the memory array with the tap regions formed between each of the divided memory array as shown in FIG. 21A.

Further, in the X-axis direction (the extension direction of the word line (not shown)), the word driver block WLD [0] is located next to MARY [0]. Similarly, the word driver block WLD [1] is located next to MARY [1], and the word driver block WLD [2] is located next to MARY [2]. In the Y-axis direction, the size of each of MARY [0] to MARY [2] and the size of each of WLD [0] to WLD [2] are the same. Further, in the X-axis direction, the size of each of MARY [0] to MARY [2] and the size of each of TAP [0] and TAP [3] are the same. Thus, it is possible to provide free space in the area between two word driver blocks in the Y-axis direction and adjacent to the tap region in the X-axis direction. The word driver power supply circuits VG [0] to VG [3] are distributed using this free space. VG [0] to VG [3] are located adjacent to TAP [0] to TAP [3] in the X-axis direction, respectively.

On the other hand, the number of rows is small in FIG. 21B. Thus, one memory array MARY [0] is provided in the Y-axis direction (the extension direction of the bit line (not shown)). Similarly to FIG. 21A, tap regions TAP [0] and TAP are formed on both sides of MARY [0] in the Y-axis direction. Further, the word driver block WLD [0] is located next to MARY [0] in the X-axis direction. Then, the word driver power supply circuits VG [0] and VG [1] are located next to TAP [0] and TAP [1], respectively.

This layout example is effective for the method of increasing the number of word driver power supply circuits as the number of rows increases (namely, for the configuration example described above with reference to FIGS. 19 and 20). More specifically, first, it is effective because the free space can be used, from the point of view of the layout area. In addition, as seen from FIG. 21A, the design tool can automatically generate the layout the complied SRAM, for example, by regularly arranging the regions of WLD [0], MARY [0], VG [0], and TAP [0] as a unit according to the number of rows. Thus, the process can be made more efficient. Note that the influence of the number of columns should be reflected in the word driver power supply circuit as described above. The reflection of the number of columns can be achieved by an appropriate adjustment of the transistor size in each of VG [0] to VG [3] shown in FIG. 21A, namely, by the method of FIG. 16 or other methods.

Figure 22:
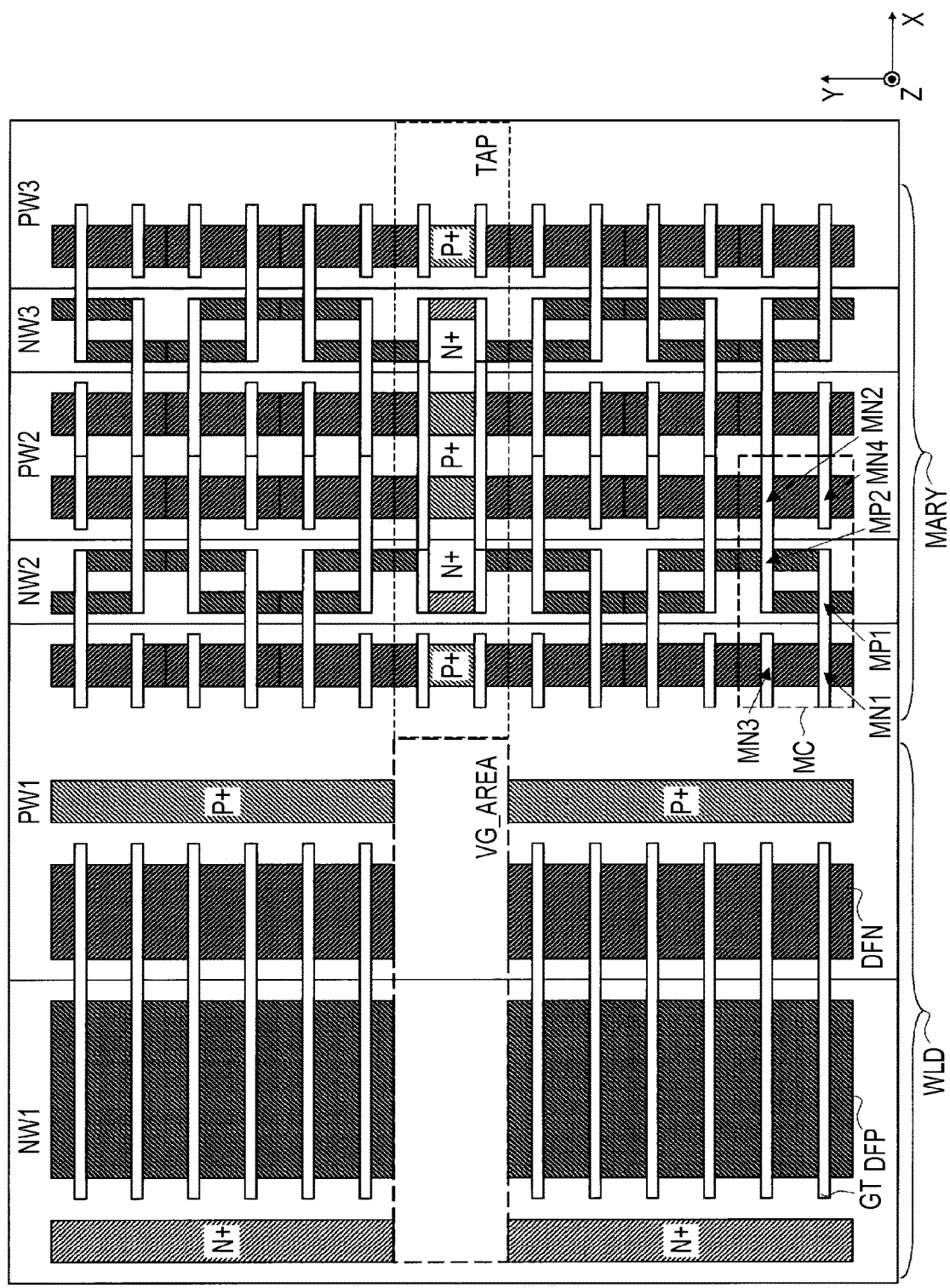
FIG. 22 is a top view of a schematic layout example of a part of the area of the static memory module in FIG. 21A.

FIG. 22 is a top view of a schematic layout example of a part of the area of the static memory module shown in FIG. 21A. For example, FIG. 22 shows the detailed layout example around VG [1] and TAP [1] in FIG. 21A. In FIG. 22, n-type wells NW1 to NW3 and p-type wells PW1 to PW3 are alternately arranged in the order of NW1, PW1, NW2, PW2, NW3, and PW3 in the X-axis direction. Note that actually n-type wells and p-type wells are also located next to PW3 according to the number of columns, but that is omitted here. The word driver block WLD is formed in NW1 and PW1. Then, the memory array MARY is formed in PW1, NW2, PW2, NW3, PW3, and so on.

In WLD, a plurality of gate layers GT extending in parallel in the X-axis direction are provided over the top (z-axis direction) of NW1 and PW1, through the gate insulating film. In NW1, p-type semiconductor layers (diffusion layers) DFP are formed on both sides (Y-axis direction) of the gate layers GT to implement a plurality of PMOS transistors. In PW1, n-type semiconductor layers (diffusion layers) DFN are formed on both sides of the gate layers GT to implement a plurality of NMOS transistors. Further, an $n^+$ type semiconductor layer (diffusion layer) N+ extending in the X-axis direction is formed in NW1. Then, a $p^+$ type semiconductor layer (diffusion layer) P+ extending in the X-axis direction is formed in PW1. N+ serves as a power supply layer of NW1, and P+ serves as a power supply layer of PW1. The $n^+$ type has a higher impurity concentration than the n type. The type has a higher impurity concentration than the p type.

Further, NW1 and PW1 include a formation region VG_AREA of the word driver power supply circuit described above. For example, it is assumed that VG_AREA in FIG. 22 corresponds to VG [1] in FIG. 21A. In this case, WLD [0] in FIG. 21A is formed on one of the two sides of VG_AREA in the Y-axis direction in FIG. 22. Then, WLD [1] in FIG. 21A is formed on the other side of VG_AREA. Although the layout example of VG_AREA is omitted in FIG. 22, PMOS and NMOS transistors are implemented in a similar way to the word driver WLD. Thus, a predetermined circuit is formed.

Here, in MARY, one memory MC is formed by two p-type wells (for example, PW1 and PW2) and one n-type well (for example, NW2) interposed between the two p-type wells. In MC, two gate layers GT extending in parallel in the X-axis direction are formed over PW1. Also, two gate layers GT extending in parallel in the X-axis direction are formed over PW2. Then, one of the two gate layers GT over PW1, as well as one of the two gate layers GT over PW2 continuously extend in the X-axis direction over NW2. In this way, the two gate layers GT are formed over NW2. Actually, each GT is formed through the gate insulating film.

The n-type semiconductor layers (diffusion layers) DFN are formed on both sides of the two gate layers GT in PW1. Thus, the access transistor (MN3) and driver transistor (MN1) of PW1 are implemented on one side of NW2 so that one end of the source/drain is shared by DFNs. Further, n-type semiconductor layers DFN are formed on both sides of the two gate layers GT in PW2. Thus, the access transistor (MN4) and driver transistor (MN2) of PW2 are implemented on the other side of NW2 so that one end of the source/drain is shared by DFNs. Further, the p-type semiconductor layers (diffusion layers) DFP are formed on both sides of the two gate layers in NW2. Thus, the load transistor (MP1) that shares GT with MN1, as well as the load transistor (MP2) that shares GT with MN2 are implemented in NW2. Similarly, in MARY, MC is formed by using PW2, PW3, and NW3 interposed between PW2 and PW3 in the X-axis direction, and by sequentially forming the gate layers GT and the semiconductor layers (diffusion layers) DFN, DFP in the Y-axis direction. In this way, MCs are sequentially formed.

Further, MARY is provided with the tap region TAP described above. For example, if TAP of FIG. 22 corresponds to the TAP [1] of FIG. 21A, MARY [0] of FIG. 21A is formed on one of the two sides of TAP in the Y-axis direction shown in FIG. 22. Then, MARY [1] of FIG. 21A is formed on the other side. In. FIG. 22, TAP includes the $p^+$ type semiconductor layers (diffusion layers) P+ that are sequentially formed in PW1, PW2, PW3, and so on, and the $n^+$ type semiconductor layers (diffusion layers) N+ that are sequentially formed in NW2, NW3, and so on. Thus, power is supplied to each well through the corresponding N+ and P+.

As described above, by using the semiconductor device according to the seventh embodiment, it is typically possible to increase the operation margin of the static memory modules included in the semiconductor device. In addition, it is possible to speed up the static memory modules. These advantages can be effectively achieved by the layout design described above.

Eighth Embodiment

<Outline of the Memory Unit>

Figure 23:
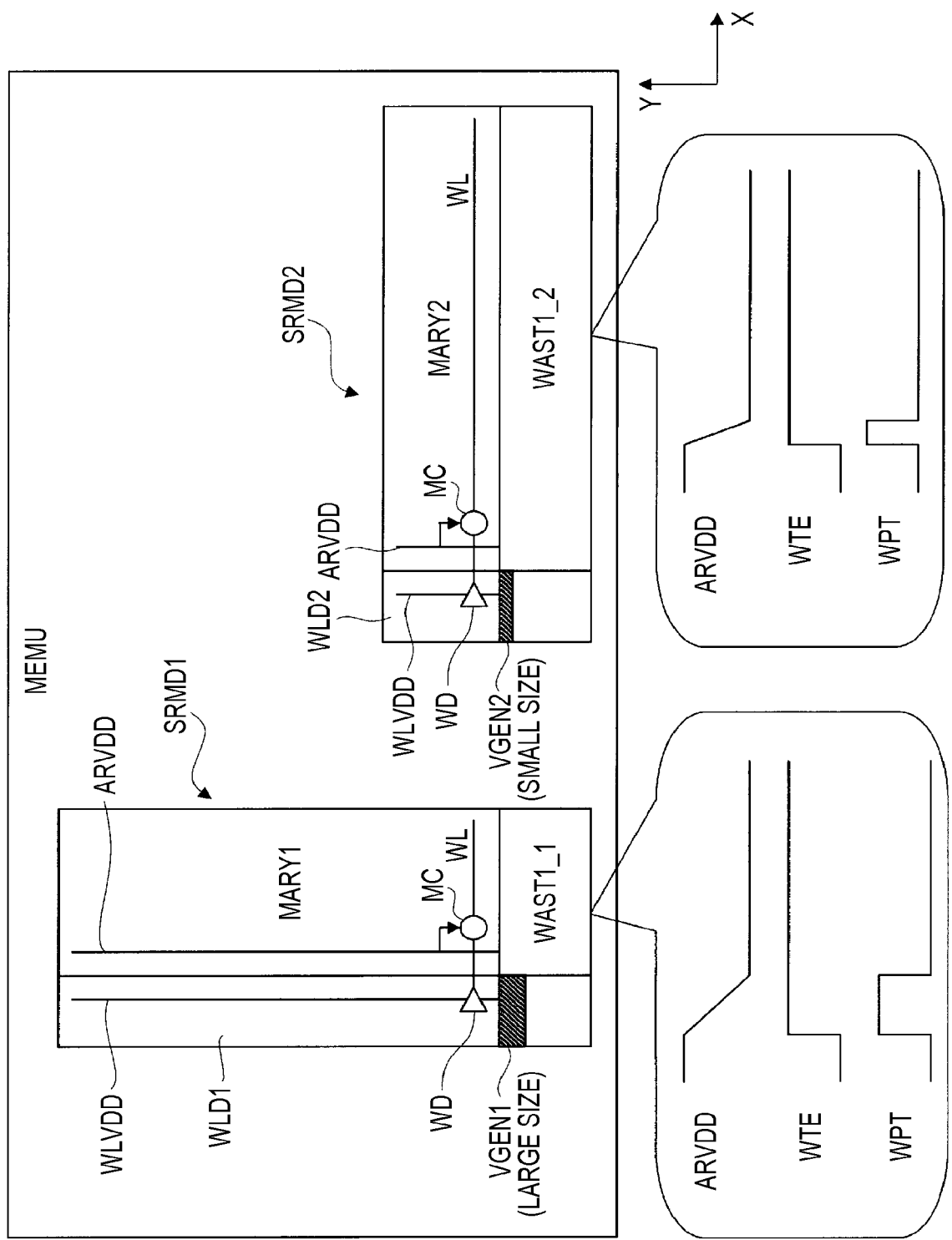
FIG. 23 is a schematic diagram of a configuration example of a memory unit included in a semiconductor device according to an eighth embodiment of the present invention.
Figure 24A:
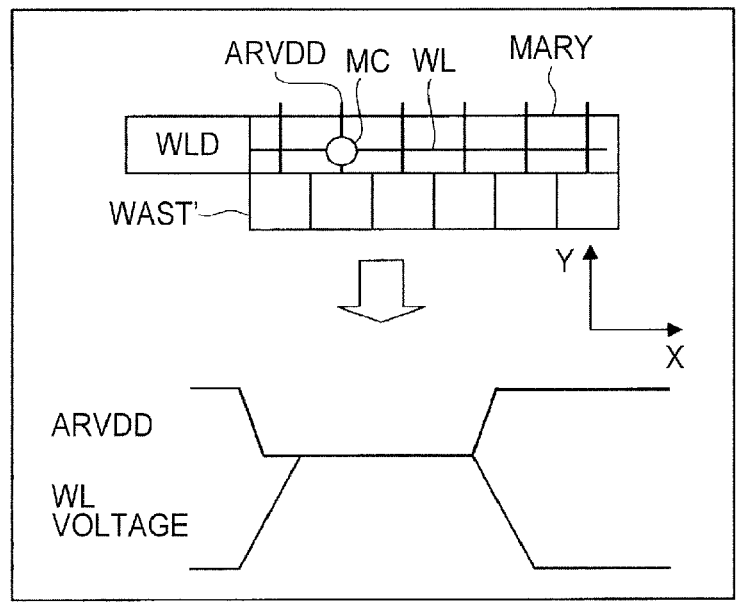
FIG. 24A is a diagram schematically showing a configuration and operation example of the main part of a static memory module in the semiconductor device subject to the present invention.
Figure 24B:
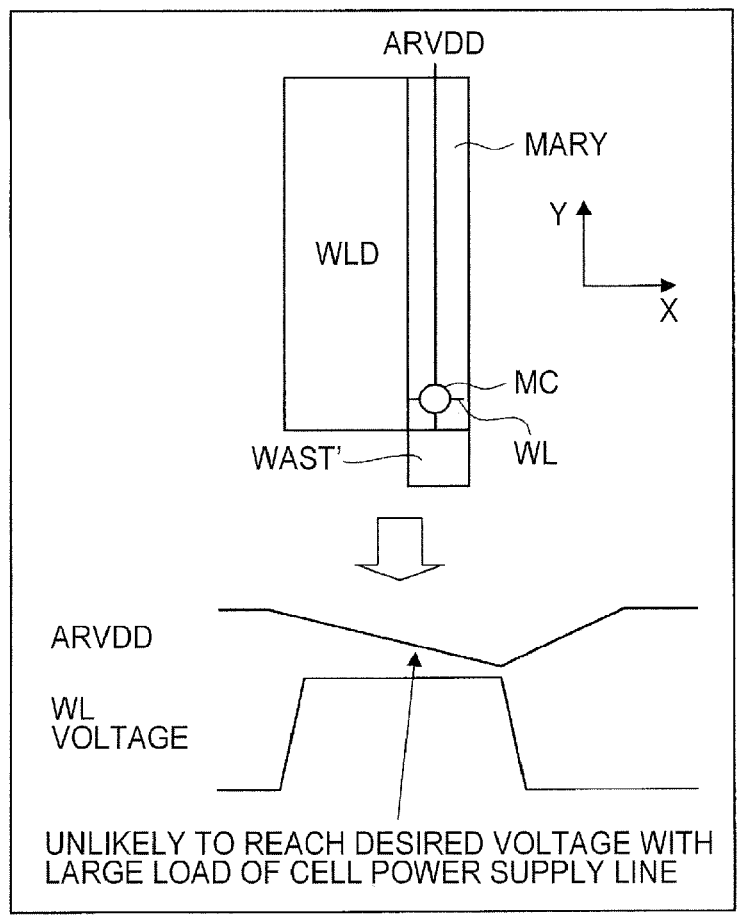
FIG. 24B is a diagram schematically showing a configuration and operation example different from the example of FIG. 24A.
Figure 25A:
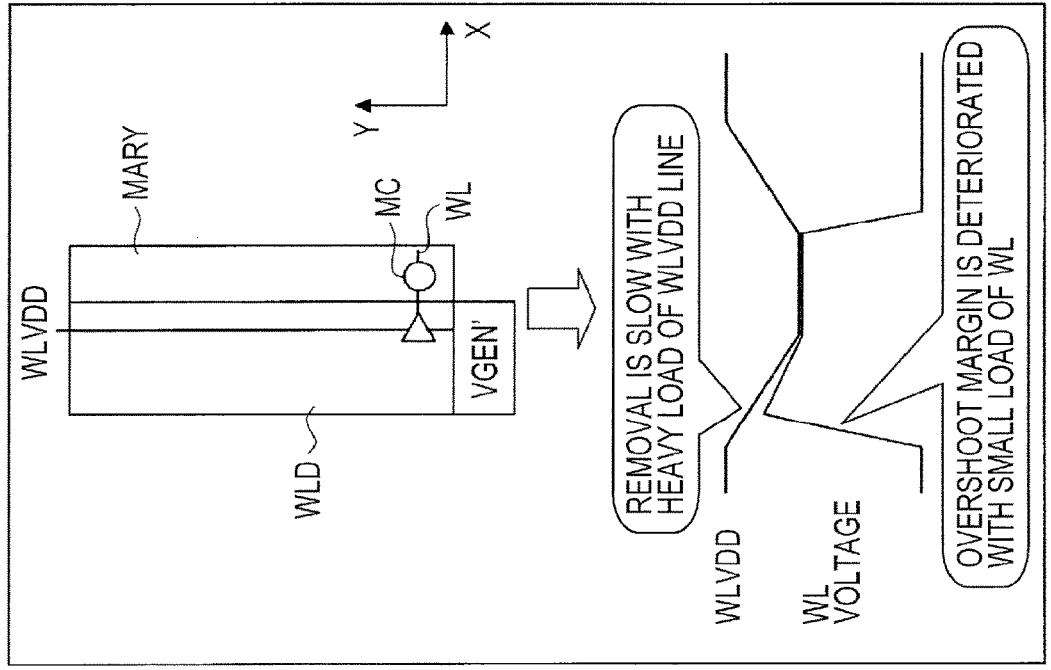
FIG. 25A is a diagram schematically showing a configuration and operation example of the main part of the static memory module in the semiconductor device subject to the present invention.
Figure 25B:
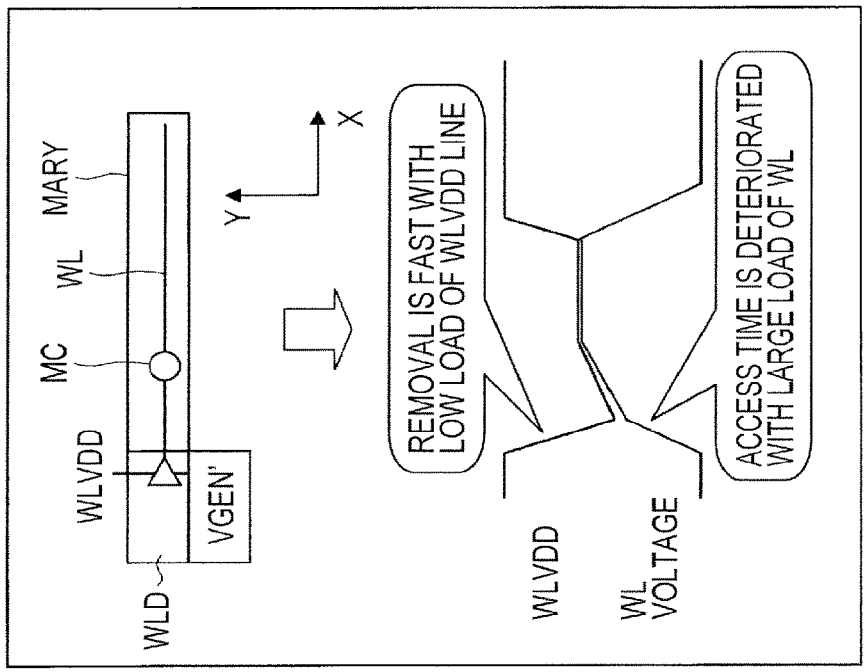
FIG. 25B is a diagram schematically showing a configuration and operation example different from the example of FIG. 25A.

FIG. 23 is a schematic diagram of a configuration example of a memory unit included in a semiconductor device according to an eighth embodiment of the present invention. The memory unit shown in FIG. 23 has the characteristics of the write assist circuit shown in FIG. 6 and other figures, as well as the characteristics of the word driver power supply circuit shown in FIG. 14 and other figures. The memory unit in FIG. 23 includes the longitudinally long static memory module SRMD1 and the laterally long memory module SRMD2, similarly to FIGS. 6 and 14.

SRMD1 includes the write assist circuit WAST1_1, and SRMD2 includes the write assist circuit WAST1_2 as described with reference to FIG. 6 and other figures. The number of rows is larger in SRMD1 than in SRMD2. In other words, the memory cell power supply line ARVDD is longer in SRMD1 than in SRMD2. Thus, the write assist pulse signal WPT with a wider pulse width than that for WAST1_2 is applied to WAST1_1. Both WAST1_1 and WAST1_2 control the reduction speed of the voltage level of ARVDD by using WPT in the write operation. Thus, it is possible to increase the write margin regardless of the array configuration.

Further, SRNMD1 includes the word driver power supply circuit block VGEN1, and SRMD2 includes the word driver power supply circuit block VGEN2 as described with reference to FIG. 14 and other figures. SRMD1 has a larger number of rows (namely, the word driver power line WLVDD is long) and has a smaller number of columns (namely, the word line WL is short), compared to SRMD2. Thus, VGEN1 has a larger size (drive capability) than VGEN2. VGEN1 and VGEN2 reduce the voltage level of WLVDD in the read operation (write operation). At this time, the drive capability for reducing the voltage level of WLVDD is optimized according to the array configuration. Thus, it is possible to increase the read margin and to reduce the access time, regardless of the array configuration.

For example, the circuit configuration example including the static unit (VSBK) and the dynamic unit (VDBK) as shown in FIGS. 7A and 7B is applied to the write assist circuits WAST1_1 and WAST1_2. On the other hand, a sort of circuit configuration example including only the static unit as shown in FIG. 16 is applied to the word driver power supply circuit blocks VGEN1 and VGEN2. The static unit switches the output voltage from a certain voltage level to a predetermined lower voltage level. The main function of the static unit is to constantly supply the predetermined voltage level. The dynamic unit operates only in the switching of the voltage level. Then, the dynamic unit has a function for controlling the switching speed of the voltage level.

Here, conceptually the write assist circuit and the word driver power supply circuit block perform substantially the same operation. That is, both the write assist circuit and the word driver power supply circuit block reduce the voltage level to control the reduction speed of the voltage level. For this reason, the dynamic unit may be applied to the word driver power supply circuit block in a similar way to the write assist circuit. Alternatively, the write assist circuit may include only the static unit in a similar way to the word driver power supply circuit block. However, there is an essential difference between the write assist circuit and the word driver power supply circuit block in the application of such configurations.

First of all, preferably the word driver power supply circuit block continuously supplies power in the read operation (write operation). However, the write assist circuit does not necessarily supply power in the write operation as described with reference to FIGS. 7A and 7B. Further, the write assist circuit can have a power supply capability (pull-up capability) that is low enough to supply low power, which is required to maintain information, to the memory cell of CMOS latch type. However, the word driver power supply circuit block that supplies power to the word driver to drive the gate layer of the MOS transistor should have a relatively high pull-up capability because the access time will depend on the pull-up capability.

As a result, the word driver power supply circuit block should have a static unit with sufficiently high pull-up capability. Thus, unlike the write assist circuit, it is not suitable for the word driver power supply circuit block to fix the pull-up capability (and the power supply removable capability (pull-down capability)) of the static unit, and to reinforce the pull-down capability by the dynamic unit. In other words, if the pull-up capability of the static unit is fixed, it is necessary to fix it to the higher side. For example, when the circuit configuration shown in FIG. 16 is used, the pull-down capability increases accordingly, so that the dynamic unit may not be necessary.

It is also possible to reinforce the pull-down capability by the dynamic unit, depending on the circuit type, on the assumption that the static unit has sufficient pull-up capability and relatively low pull-down capability. However, the dynamic unit requires a transistor with a size larger than the originally large transistor of the static unit. Thus, a reduction in the area efficiency and the like may occur. For this reason, it is preferable that the word driver power supply circuit block includes only the static unit to adjust the entire drive capability (pull-up and pull-down capabilities) to control the rate of fall of the voltage level accordingly.

On the other hand, since the pull-up capability is not so required in the write assist circuit, it is possible to use the static unit with a fixed capability regardless of the array configuration, as described above. Thus, it is possible to use the method of adjusting the pull-up capability (and the pull-down capability) of the static unit like the word driver power supply circuit block. However, this method may not be effective in terms of area and layout design. In this way, it is possible to provide the static unit with fixed pull-up capability (and pull-down capability) in the write assist circuit. However, the required pull-down capability can vary according to the array configuration, as described above. Thus, it is preferable to use the method of providing the dynamic unit in the write assist circuit to reinforce the pull-down capability according to the array configuration, in addition to the static unit.

As described above, by using the semiconductor device according to the eighth embodiment, it is typically possible to increase the operation margin (write margin, read margin) of the static memory modules included in the semiconductor device. In addition, it is possible to speed up the static memory modules.

While the invention made by the present inventors has been described in detail with reference to the preferred embodiments, it will be appreciated that the present invention is not limited to the embodiments described hereinbefore and various modifications and changes may be made thereto without departing from the spirit and scope of the invention.

For example, the SRAM described herein is embedded in the semiconductor device such as SOC and microcomputer. However, the present invention is not necessarily limited to such an embedded SRAM. The present invention can also be applied to general-purpose stand-alone SRAM products (semiconductor storage devices). Here, the SRAM is shown as a single port SRAM, but it goes without saying that dual port SRAM or other SRAM types can also be used. In particular, the semiconductor device according to the embodiments of the present invention that uses the advance process in which the operation margin could be reduced, is useful for complied SRAM applications. However, it goes without saying that the present invention is not limited thereto, and can also be applied to semiconductor devices including a plurality of SRAM memory arrays by using various processes.

What is claimed is:

1. A semiconductor device comprising:
   a first memory module including:
      a plurality of first word lines, each first word line extending in a first direction,
      a first pair of bit lines, each bit line of the first pair extending in a second direction crossing the first direction,
      a first memory cell coupled with one of the plurality of first word lines and the first pair of bit lines,
      a first power supply line coupled with the first memory cell for supplying a first voltage to the first memory cell, and
      a first MISFET coupled with the first power supply line, and configured to reduce the first voltage to a second voltage lower than the first voltage; and
   a second memory module including:
      a plurality of second word lines, each second word line extending in a third direction,
      a second pair of bit lines, each bit line of the second pair extending in a fourth direction crossing the third direction,
      a second memory cell coupled with one of the second word lines and the second pair of bit lines,
      a second power supply line coupled with the second memory cell for supplying a third voltage to the second memory cell, and
      a second MISFET coupled with the second power supply line, and configured to reduce the third voltage to a fourth voltage lower than the third voltage;
   wherein a number of the first word lines included in the first memory module is larger than a number of the second word lines included in the second memory module, and
   wherein a gate width of the first MISFET is larger than a gate width of the second MISFET.

2. The semiconductor device of claim 1, wherein the third voltage and the fourth voltage are higher than a ground power supply voltage.

3. The semiconductor device according to claim 2, wherein the first memory module includes:
   a third memory cell coupled with said one of the plurality of first word lines and a third pair of bit lines, each bit line of the third pair extending in the second direction, and
   a third power supply line extending in the second direction, and supplying the first voltage to the third memory cell,
wherein the second memory module includes:
   a fourth memory cell coupled with said one of the plurality of second word lines and a fourth pair of bit lines, each bit line of the fourth pair extending in the fourth direction, and
   a fourth power supply line extending in the fourth direction, and supplying the second voltage to the fourth memory cell,
wherein the third power supply line is coupled with the first MISFET, and
wherein the fourth power supply line is coupled with the second MISFET.

4. The semiconductor device of claim 1, wherein the first MISFET is a p-channel MISFET, and the second MISFET is a p-channel MISFET.

5. The semiconductor device of claim 1,
wherein a gate of the first MISFET receives a first control signal,
wherein the first MISFET has a first source-drain path coupled between the first power supply line and a first power supply node,
wherein a gate of the second MISFET receives a second control signal, and
wherein the second MISFET has a second source-drain path coupled between the second power supply line and a second power supply node.

6. The semiconductor device of claim 1,
wherein the first MISFET includes a plurality of first p-channel MISFETs,
wherein the gate width of the first MISFET is a sum of gate widths of the plurality of first p-channel MISFETs,
wherein the second MISFET includes a plurality of second p-channel MISFETs, and
wherein the gate width of the second MISFET is a sum of gate widths of the plurality of second p-channel MISFETs.

7. The semiconductor device of claim 1,
wherein the first MISFET reduces a voltage of the first power supply line, corresponding to the first memory cell to be written, to the second voltage during a write operation, and
wherein the second MISFET reduces a voltage of the second power supply line, corresponding to the second memory cell to be written, to the fourth voltage during a write operation.

8. The semiconductor device of claim 1,
wherein a length of the first pair of bit lines is longer than a length of the second pair of bit lines.

9. The semiconductor device of claim 1,
wherein the first memory module includes a third MISFET coupled with the first power supply line and configured to reduce a voltage of the first power supply line to the second voltage in response to a third control signal, and
wherein the second memory module includes a fourth MISFET coupled with the second power supply line and configured to reduce a voltage of the second power supply line to the fourth voltage in response to a fourth control signal.

10. The semiconductor device of claim 9,
wherein the third MISFET is a first n-channel MISFET,
wherein the third MISFET has a gate for receiving the third control signal, and a source-drain path coupled between the first power supply line and a first ground power supply node,
wherein the fourth MISFET is a second n-channel MISFET, and wherein the fourth MISFET has a gate for receiving the fourth control signal, and a source-drain path coupled between the second power supply line and a second ground power supply node.

11. The semiconductor device of claim 9, wherein the third MISFET is a first p-channel MISFET, wherein the third MISFET has a gate for receiving the third control signal, and a source-drain path coupled between the first power supply line and a gate of the first MISFET, wherein the fourth MISFET is a second p-channel MISFET, and wherein the fourth MISFET has a gate for receiving the fourth control signal, and a source-drain path coupled between the second power supply line and a gate of the second MISFET.

12. The semiconductor device of claim 1, wherein the first power supply line extends in the second direction, and wherein the second power supply line extends in the fourth direction.

* * * * *